US005783336A

United States Patent [19]

Aoki et al.

[11] Patent Number: 5,783,336
[45] Date of Patent: Jul. 21, 1998

[54] MASK FOR EXPOSURE

[75] Inventors: Masami Aoki, Yokohama; Yusuke Kohyama, Yokosuka; Soichi Inoue; Akiko Nikki, both of Yokohama, all of Japan

[73] Assignee: Kabushiki Kaisha Toshiba, Kawasaki, Japan

[21] Appl. No.: 729,281

[22] Filed: Oct. 10, 1996

[30] Foreign Application Priority Data

Oct. 13, 1995 [JP] Japan ................................ 7-265862
Oct. 13, 1995 [JP] Japan ................................ 7-265863

[51] Int. Cl.$^6$ ........................................................ G03F 9/00
[52] U.S. Cl. .............................................................. 430/5
[58] Field of Search ................................ 430/5, 322, 324

[56] References Cited

U.S. PATENT DOCUMENTS 5,541,025  7/1996  Oi et al. ........................................ 430/5
5,637,424  6/1997  Haruki et al. ................................. 430/5

FOREIGN PATENT DOCUMENTS 6-167801  6/1994  Japan.
6-308714  11/1994  Japan.

Primary Examiner—S. Rosasco
Attorney, Agent, or Firm—Oblon, Spivak, McClelland, Maier & Neustadt, P.C.

[57] ABSTRACT

A mask for exposure includes a light transmitting substrate, a plurality of substantially oblong, island-like light transmitting sections arranged periodically on the substrate, an opaque section formed on the substrate except where the light transmitting sections are arranged, and a plurality of phase shifter layers selectively formed in the light transmitting sections. The light transmitting sections include paired light transmitting sections opposed to each other at one end portion, and one of the phase shifter layers is formed in one of the paired light transmitting sections. An interval between the paired light transmitting sections at one end portion is smaller than an interval between adjacent ones of the light transmitting sections at portions other than the one end portion.

20 Claims, 17 Drawing Sheets

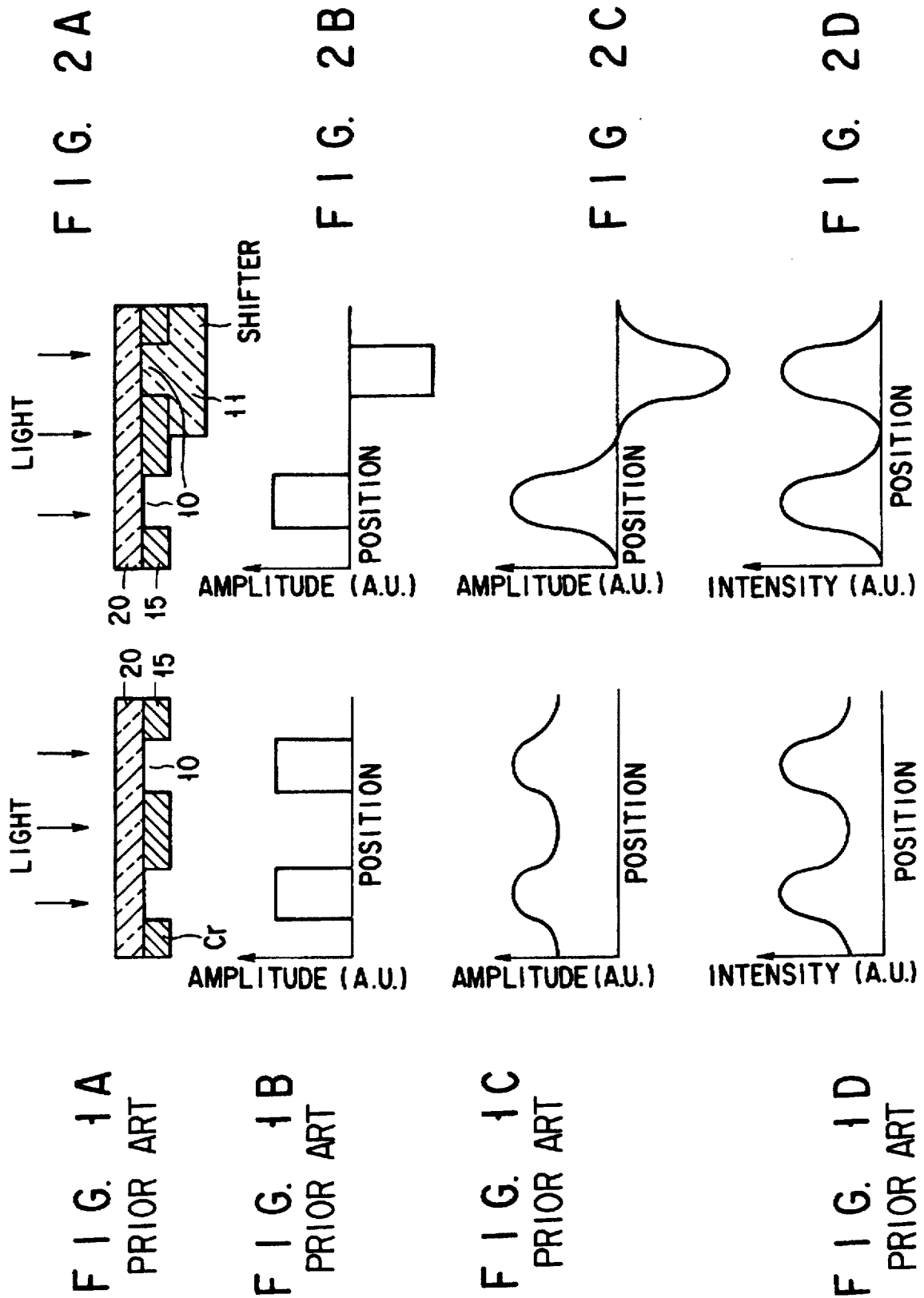

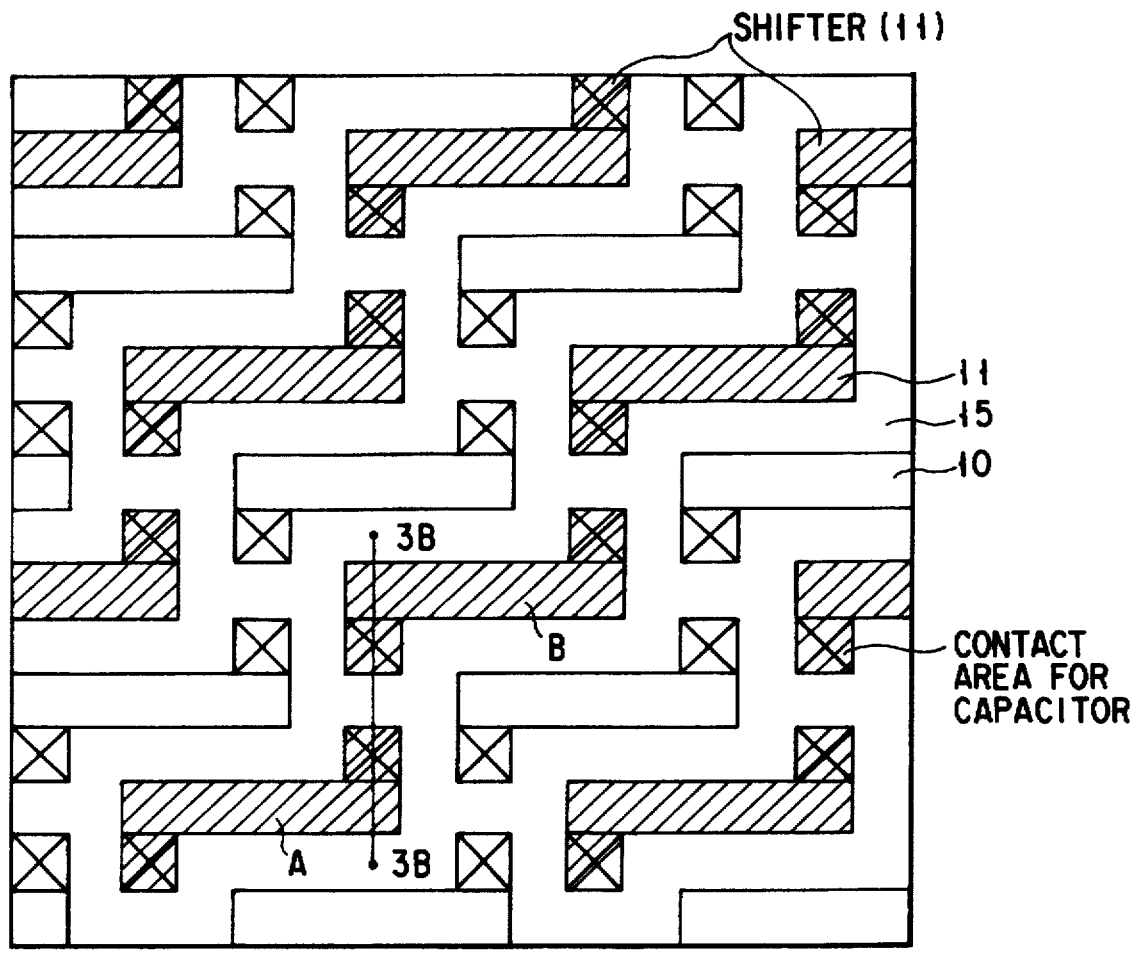
FIG. 3A
PRIOR ART
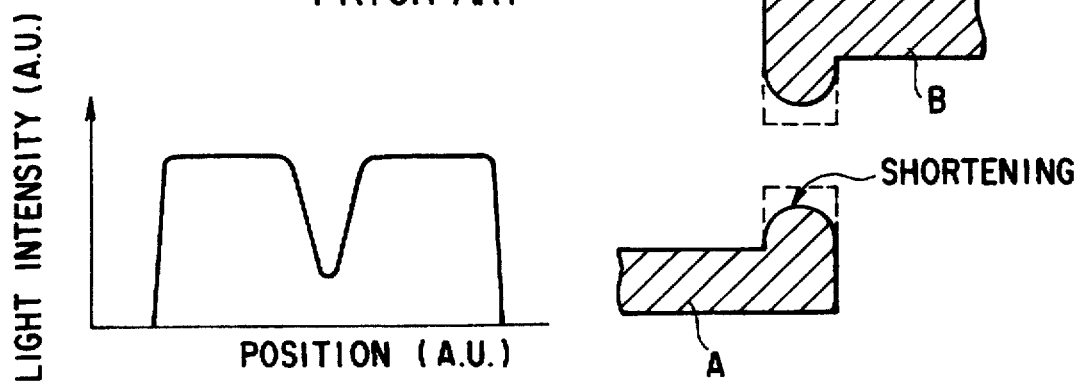
FIG. 3B
PRIOR ART
FIG. 3C
PRIOR ART

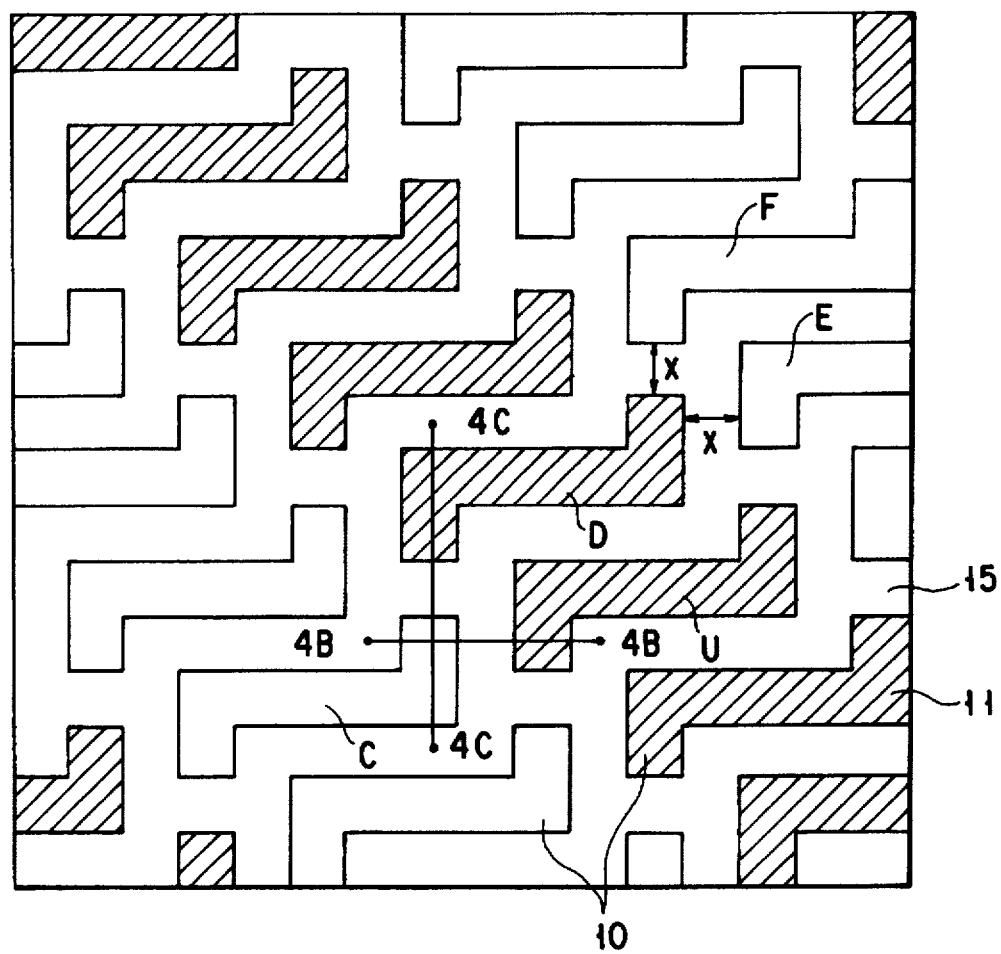
F I G. 4A
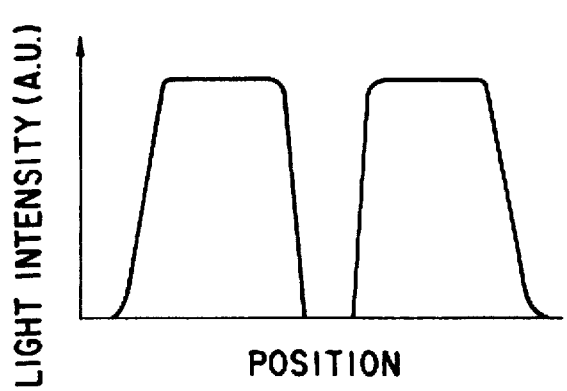
F I G. 4B
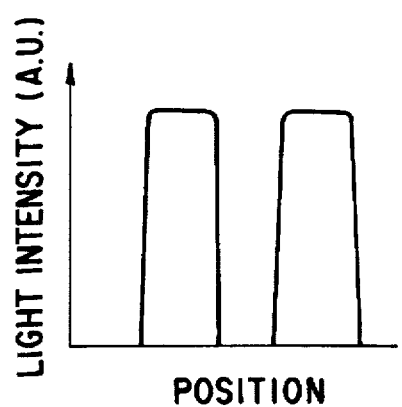
F I G. 4C

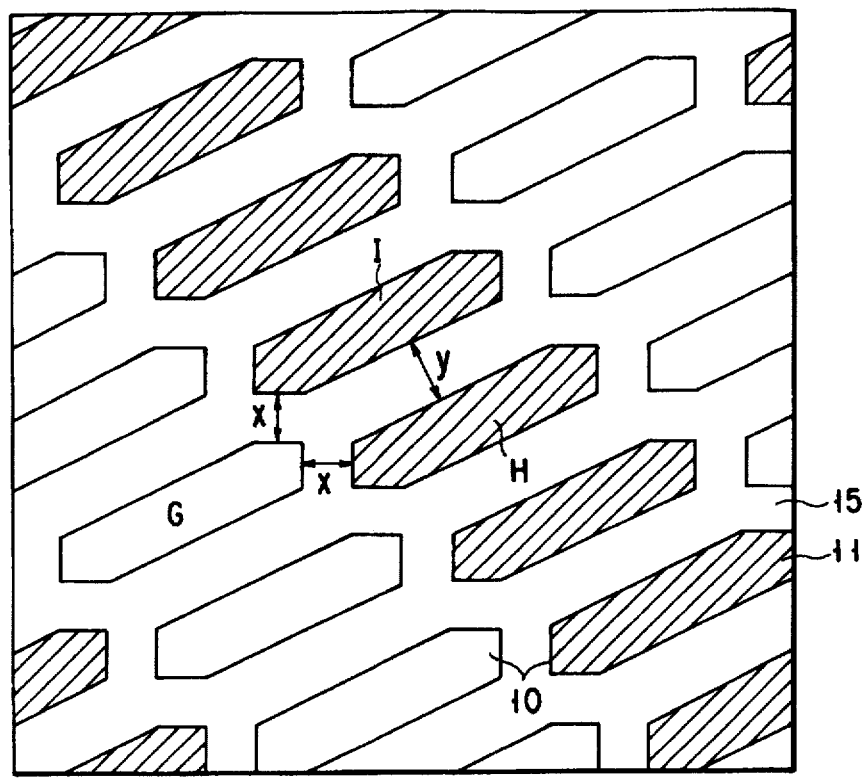
F I G. 5
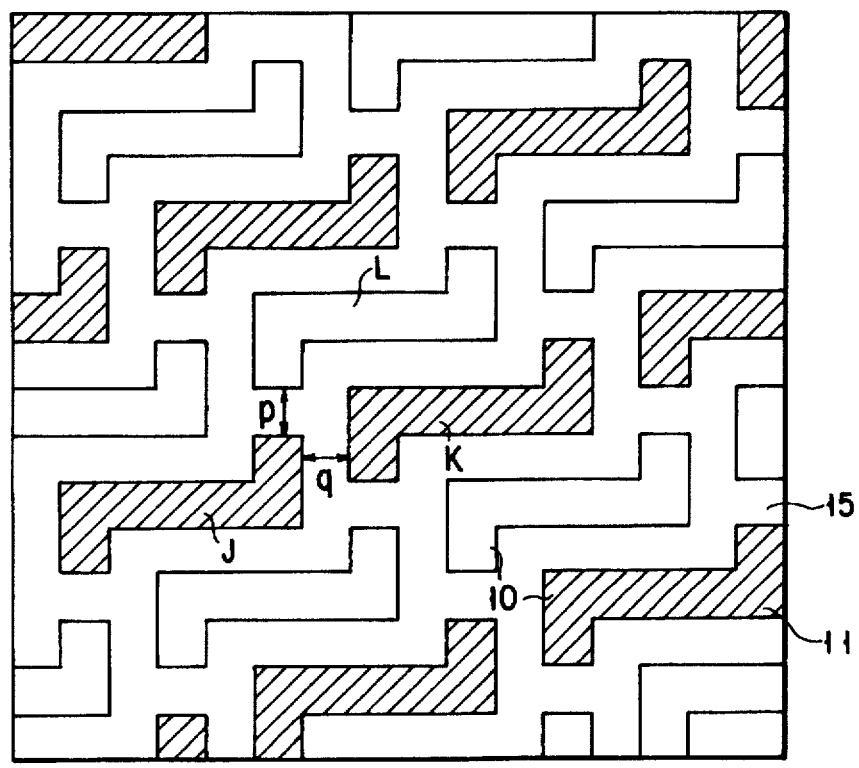
F I G. 6

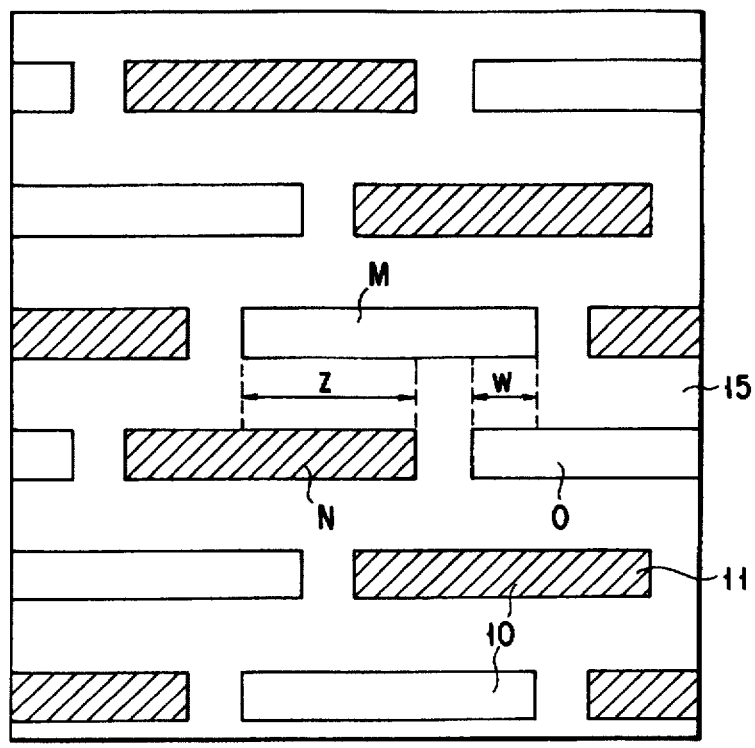
F I G. 9
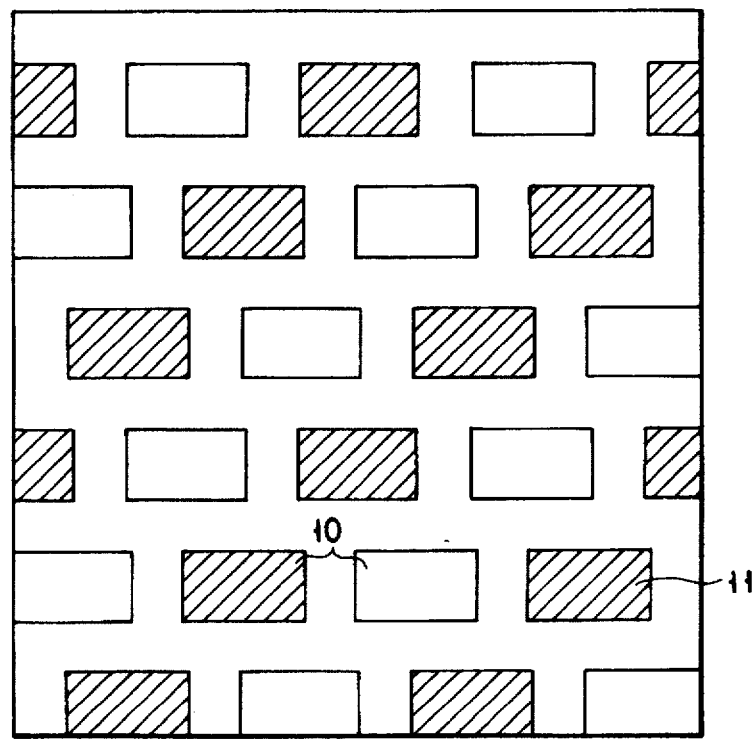
F I G. 10

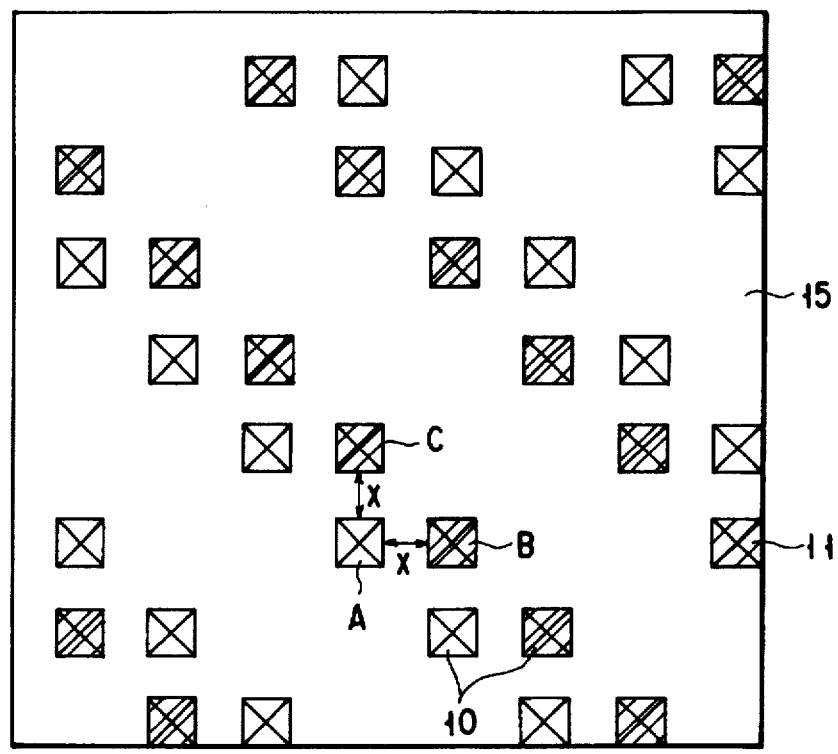
F I G. 11A
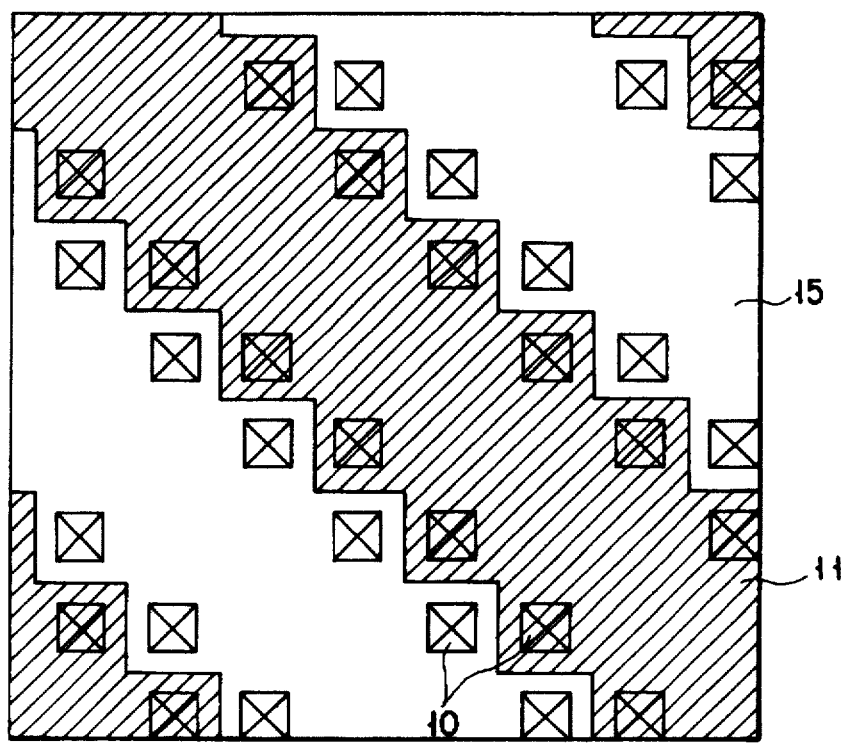
F I G. 11B

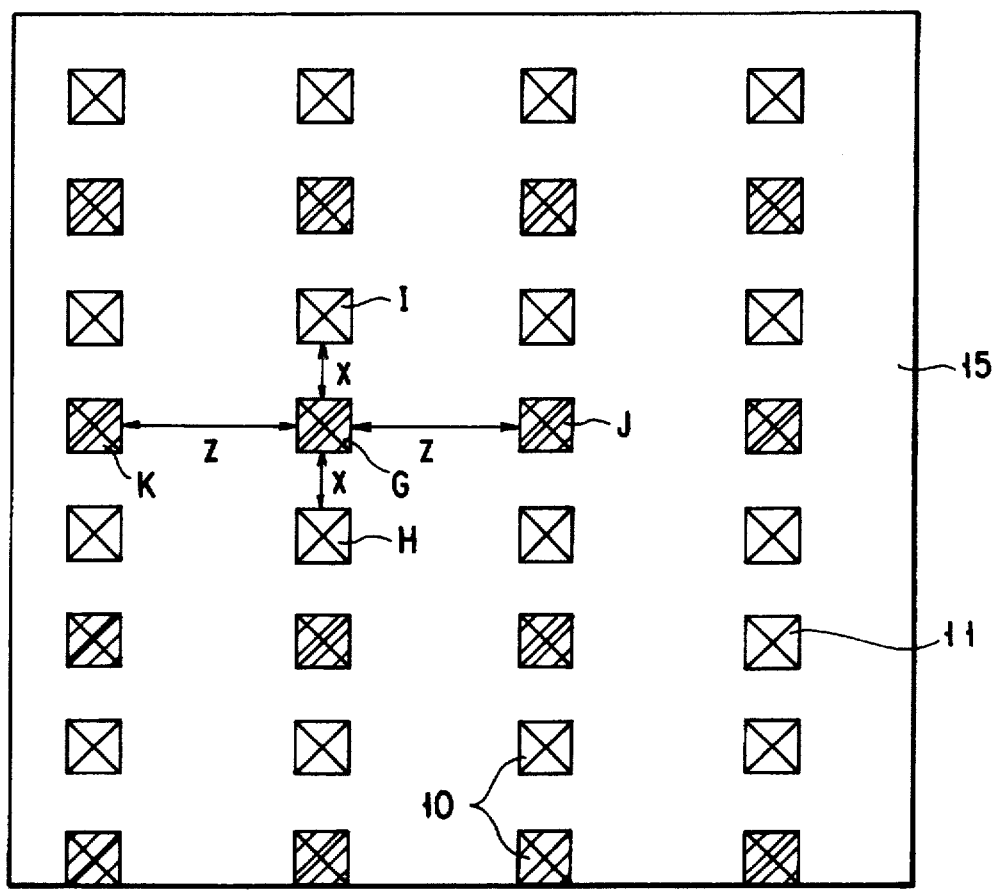
F I G. 13

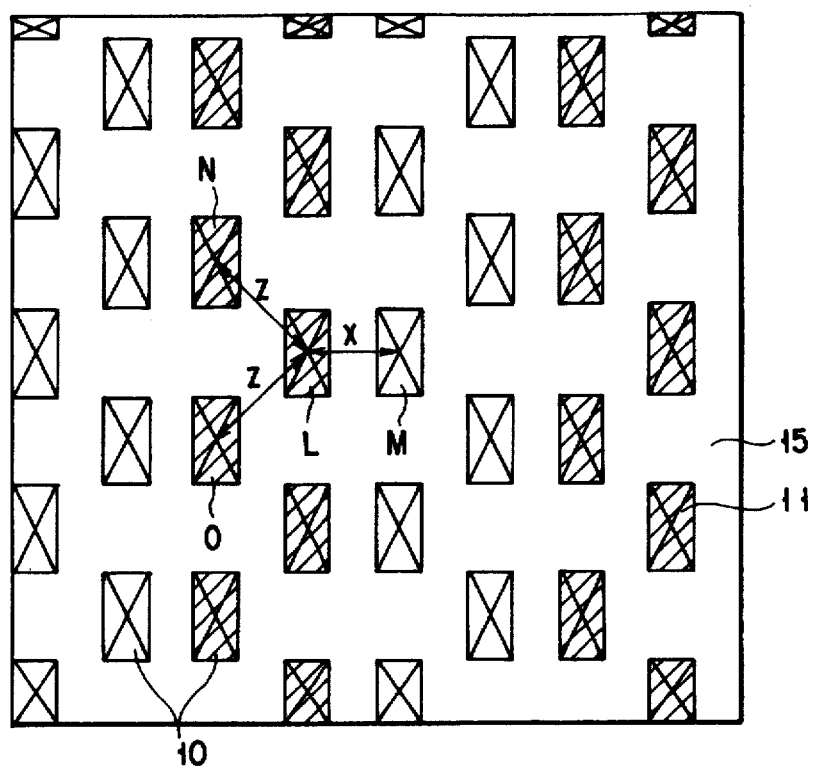
F I G. 14A
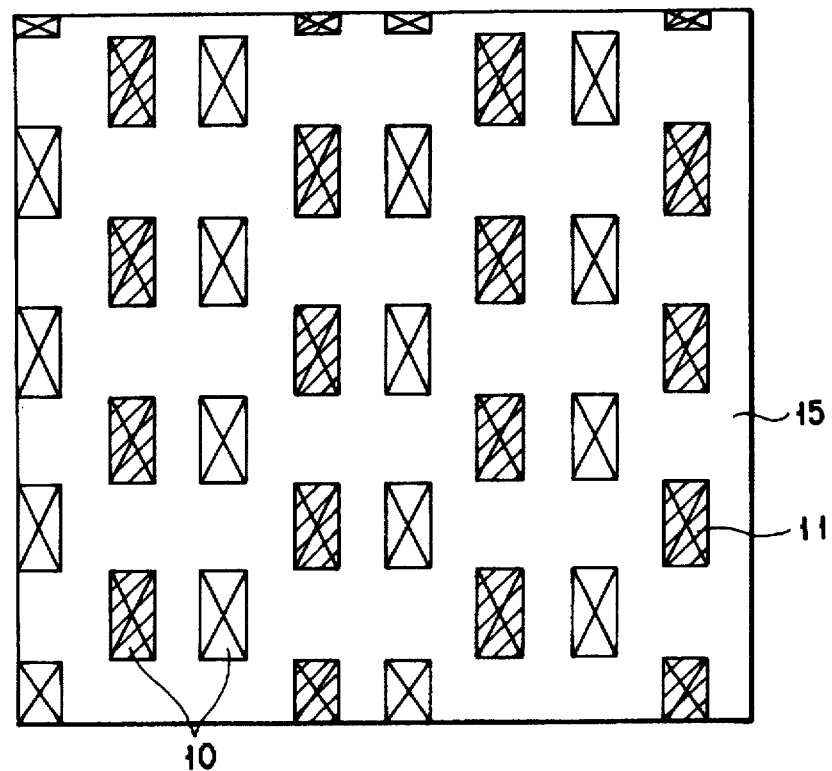
F I G. 14B

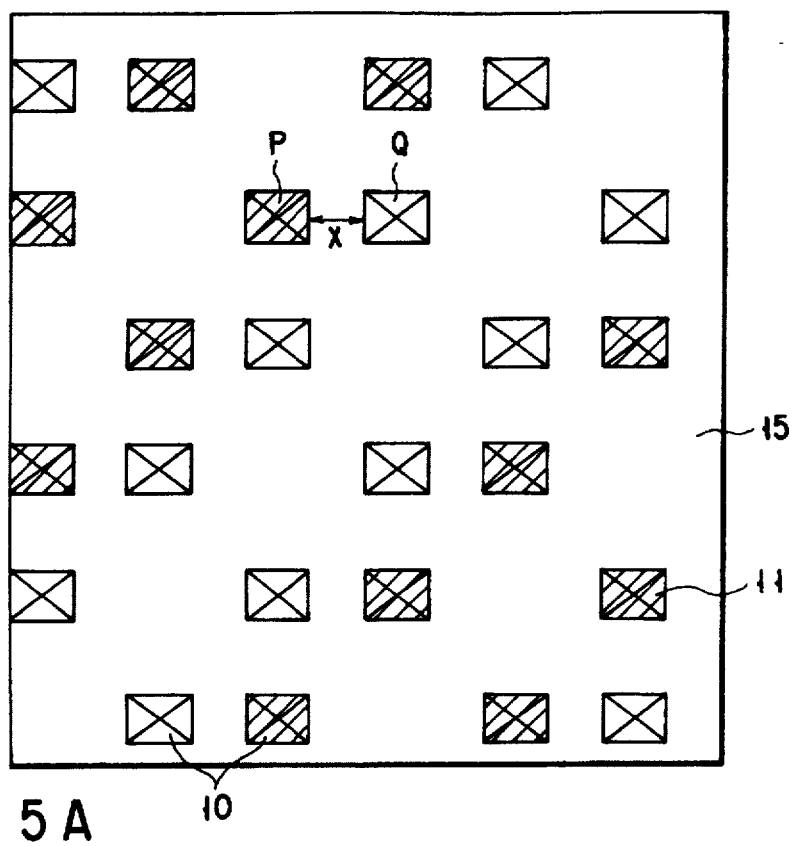
F I G. 15A
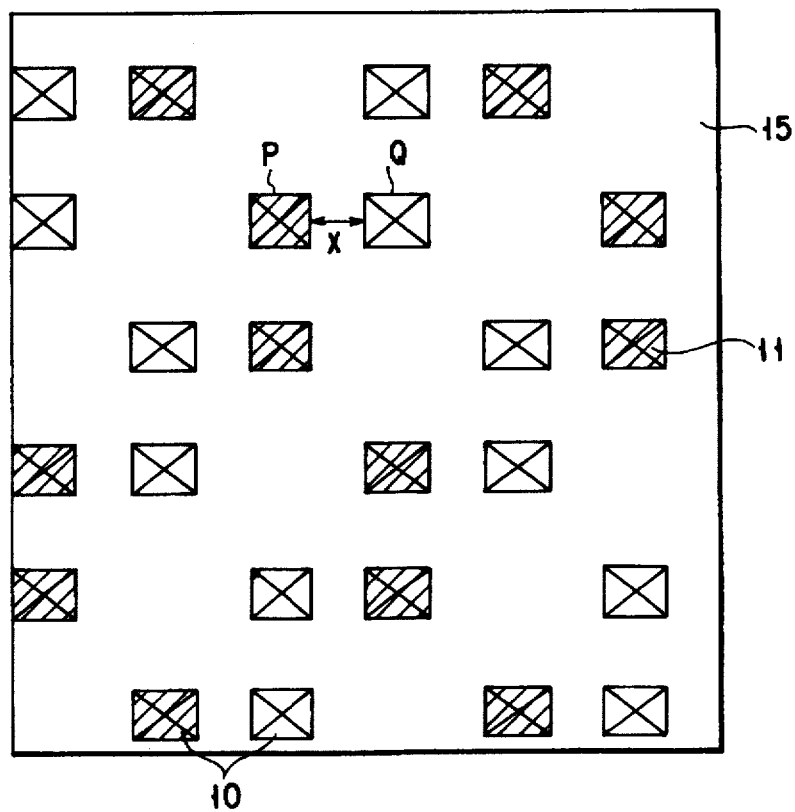
F I G. 15B

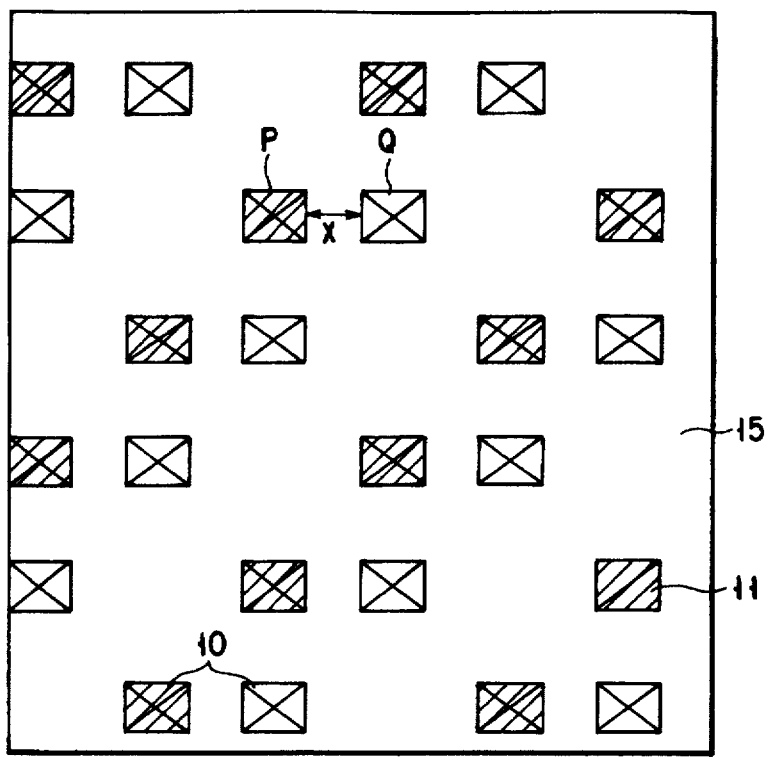
F I G. 15C
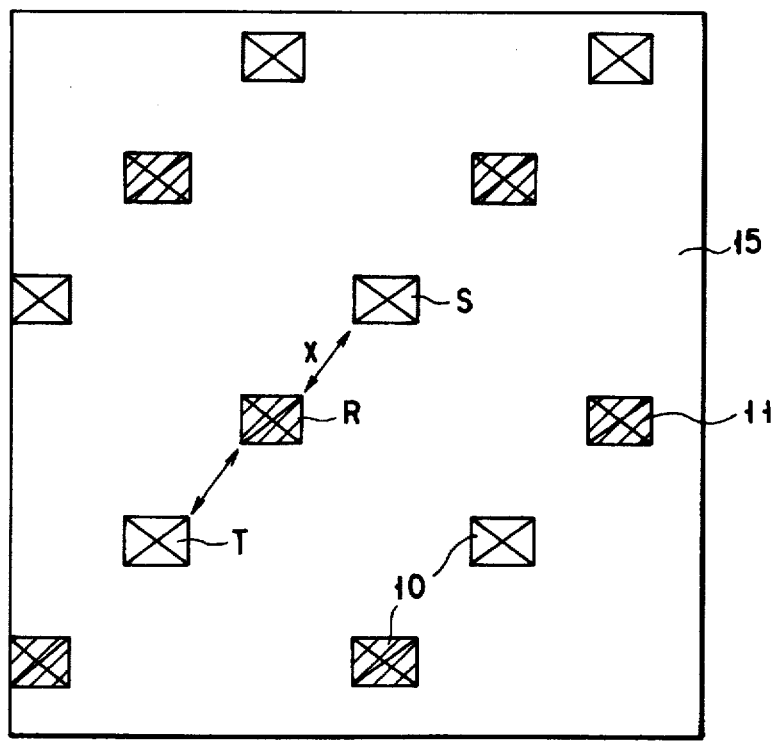
F I G. 16

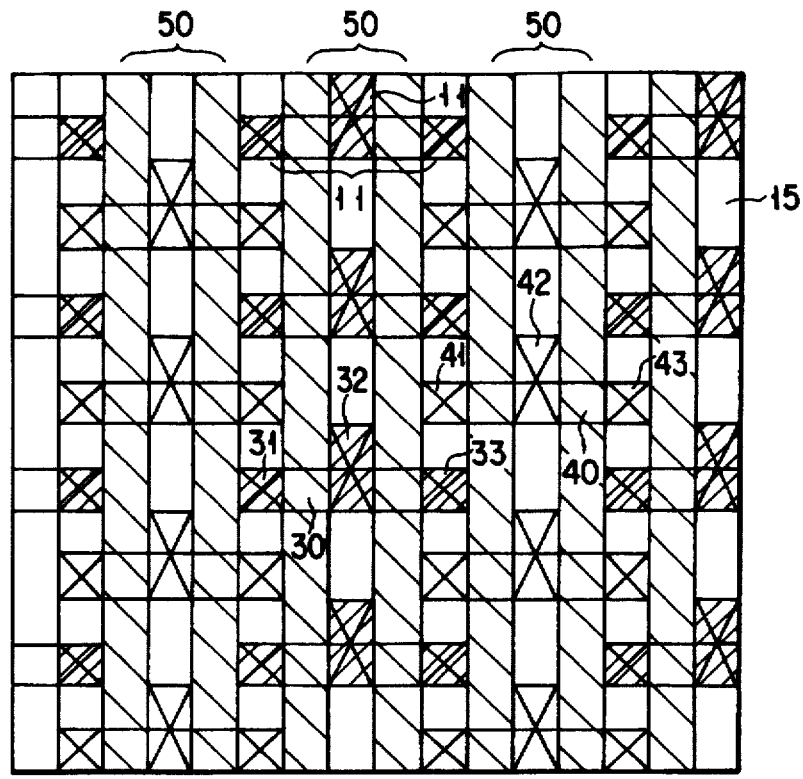
F I G. 19
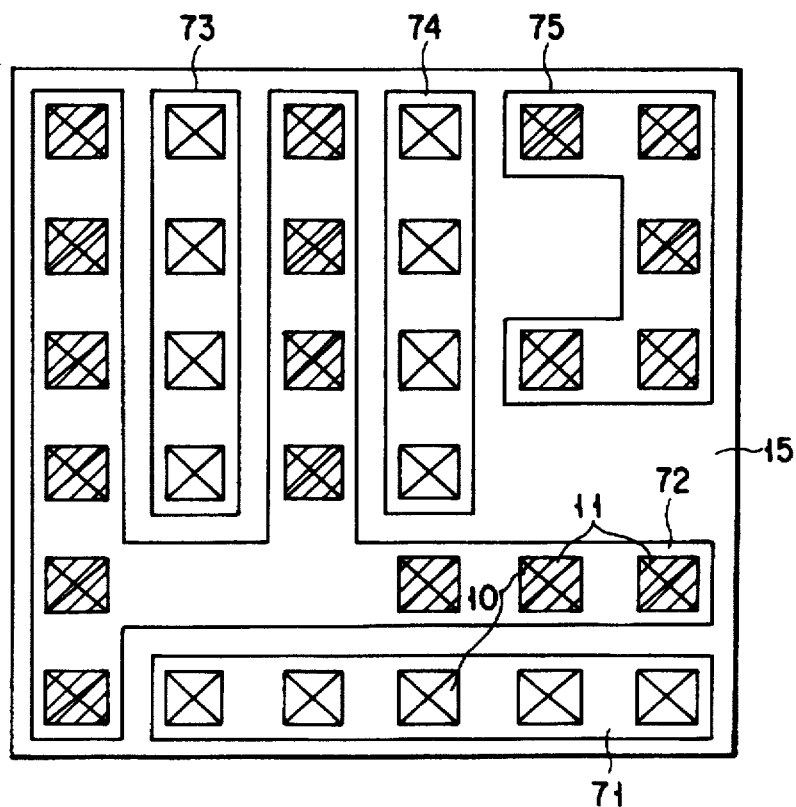
F I G. 22

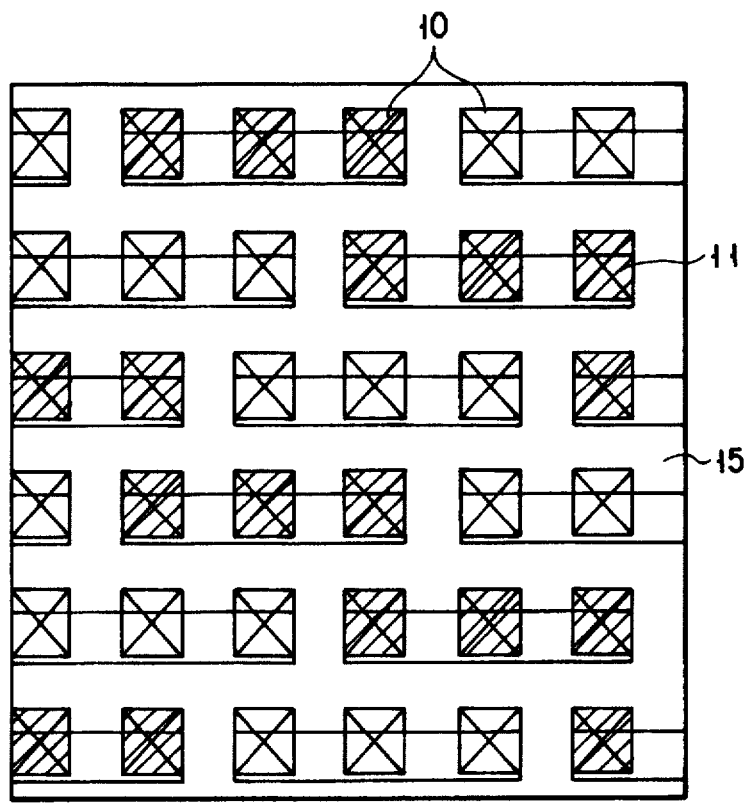
F I G. 21A
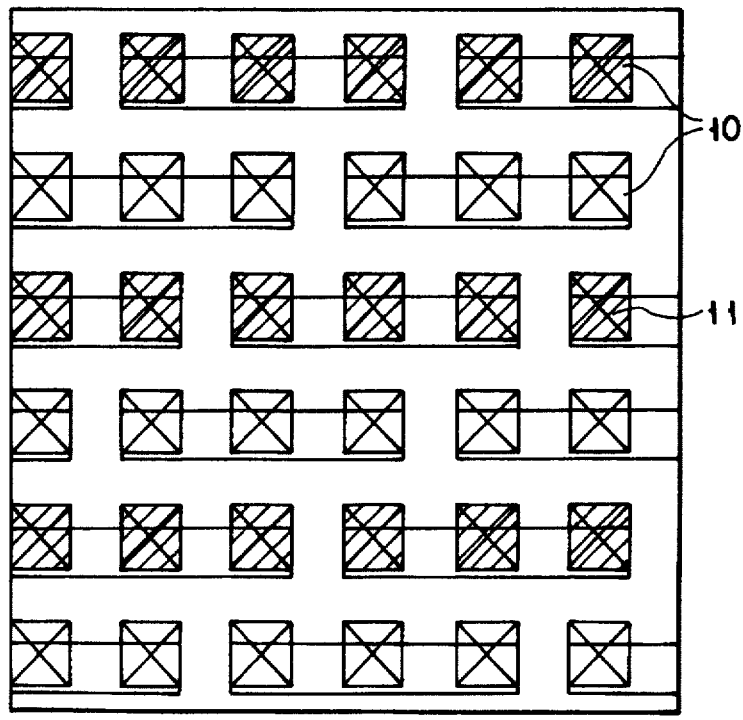
F I G. 21B

MASK FOR EXPOSURE

BACKGROUND OF THE INVENTION

1. Field of the Invention

The present invention relates to a mask for exposure using a phase shifting effect and, more particularly, to a mask for exposure improved in the way of arranging a phase shifter.

2. Description of the Related Art

Semiconductor devices have recently been making great progress in miniaturization, and the minimum dimension of the devices nearly falls within a range which is shorter than the wavelength of light. It is thought that a lithography technology having a resolution of 0.15 µm or less is required for achieving a gigabit grade DRAM device, for example. As a method of attaining such a resolution with a considerably great focal depth, a so-called phase shifting technology wherein the profile of light intensity is improved by giving a phase difference to light transmitted through a photomask, has lately attracted attention.

Of various types of phase shifting method, proposed, a spatial frequency modulation method (M. C. Levenson et al., "Improving Resolution Photolithography with a Phase-Shifting Mask," *IEEE Transactions on Electron Devices*, Vol. ED-29, No. 12, December, 1982, pp. 1828–1836) is proposed as the most effective one. This method is also called an alternated phase shifting method.

Referring to the accompanying drawings, the principle of the alternated phase shifting method will be described in comparison with the prior art method. The prior art method is shown in FIGS. 1A to 1D, while the alternated phase shifting method is shown in FIGS. 2A to 2D. FIGS. 1A and 2A are cross-sectional views of masks where a light shielding film 15 (e.g., a Cr film) is selectively formed under a light transmitting substrate 20 and a portion of the substrate 20, which is not covered with the opaque film, serves as a light transmitting section 10. In the alternated phase shifting method, an opaque film 11 is formed in one of adjacent light transmitting sections 10.

FIGS. 1B and 2B, 1C and 2C, and 1D and 2D are graphs depicting the distributions of amplitudes of light transmitted through the mask, those of amplitudes of light transmitted to the wafer, and those of intensities of light transmitted to the wafer, respectively. The abscissas of the graphs shown in FIGS. 1B to 1D and 2B to 2D correspond to the lateral direction of the sections shown in FIGS. 1A and 2A.

According to the alternated phase shifting method, the phase of light passing through adjacent openings on the mask is shifted 180 degrees by arranging a phase shifter in one of the adjacent openings, and the profile of intensity of the passing light is varied sharply using the interference of light. Since the light passing through the adjacent openings is used, a great effect is created for a simple line-and-space pattern and a checker pattern. Since, however, a pattern for forming respective layers of the actual device is more complicated, it is necessary to contrive the way of arranging the phase shifter.

FIG. 3A shows an example wherein a phase shifter is used in an active region pattern of a DRAM (T. Kaga et al., "A 0.29 µm² MTM-CROWN Cell and Process Technologies for 1-Gigabit Drams", *Technical Digest of International Electron Devices Meeting*, 1994, pp. 927–929). In this example, the phase shifter is arranged in a device pattern of a ¼ pitch array system (the active region pattern, which is periodically formed along the bit lines and shifted by a ¼ period in adjacent bit lines, is repeated along the word lines and thus the same array is periodically repeated every four bit lines). In this layout of the phase shifter, since the end portions of island-like patterns A and B are opposed to each other in phase, the profile of light intensity at the opposing portions is dulled as shown in FIG. 3B, and the patterns A and B become difficult to separate from each other. If an amount of exposure is decreased to reliably separate the patterns A and B, a shortening will occur at the end portions of the patterns A and B as shown in FIG. 3C.

Since contact holes for connecting storage electrodes are formed at the end portions of the patterns in the succeeding process, the shortening reduces a margin for contacting the storage electrodes. Particularly, the ¼ pitch array system has a drawback wherein it is hard to provide a sufficiently large space around the contact hole and thus easy to cause a shortening which exercises a great influence on the yield of memory cells.

As described above, conventionally, it is difficult to effectively apply a phase shifting method to island-like patterns. In particular, a pattern requiring an exact size such as a contact hole, has a problem of making it difficult to separate patterns from each other and thus causing a shortening.

SUMMARY OF THE INVENTION

An object of the present invention is to provide a mask for exposure capable of forming a device pattern more minutely by optimally arranging phase shifters in island-like patterns.

To attain the above object, according to a first aspect of the present invention, there is provided a mask for exposure, comprising:

a light transmitting substrate;

a plurality of substantially oblong, island-like light transmitting sections arranged periodically on the substrate;

an opaque section formed on the substrate except where the light transmitting sections are arranged; and a plurality of phase shifter layers selectively formed in the light transmitting sections, wherein the light transmitting sections include paired light transmitting sections opposed to each other at one end portion, and one of the plurality of phase shifter layers is formed in one of the paired light transmitting sections, an interval between the paired light transmitting sections at one end portion being smaller than an interval between adjacent ones of the light transmitting sections at portions other than the one end portion.

The plurality of light transmitting sections can be formed to serve as regions for forming a plurality of memory cells constituting a memory cell array, and the memory cell array can be constituted to include a plurality of bit lines and a plurality of word lines crossing each other.

The plurality of light transmitting sections can be formed out of the same pattern and arranged at a fixed period in a direction of the bit lines and at regular intervals in a direction of the word lines. The light transmitting sections can be formed on the bit lines and shifted in sequence every ¼ of the fixed period in one direction of the bit lines, and each of the light transmitting sections has end portions bent in opposite directions with each other.

Otherwise, the plurality of light transmitting sections can be formed out of the same pattern and arranged at a fixed period in a direction of the bit lines and at regular intervals in a direction of the word lines. The light transmitting sections obliquely cross the bit lines and are shifted every ¼ of the fixed period in one direction of the bit lines.

The plurality of light transmitting sections include paired light transmitting sections arranged adjacent to each other in the direction of the word lines and opposed to each other at portions other than the one end portion. The phases of light transmitted through the paired light transmitting sections can be the same or opposite to each other.

It is preferable that the plurality of light transmitting sections should have a contact hole in the central part thereof, to which a corresponding one of the bit lines is connected, and contact holes at end portions thereof, to which capacitors are connected.

It is preferable that the plurality of phase shifter layers shift phases of light transmitted through the light transmitting sections substantially 180 degrees.

According to the first aspect of the present invention described above, since a phase shifter layer is formed in one of paired light transmitting sections whose end portions are opposed to each other with the minimum interval, the profile of light intensity at the end portions can be varied sharply. For example, if this arrangement is applied to active region patterns of DRAM, the dimensions of end portions of the patterns can be controlled with precision. There are many cases where a strict control is required for the dimensions of the end portions of the patterns in order to form contact holes therein. The strict control thus produces good results of allowing the patterns to be reliably separated from each other and preventing a short circuit from occurring.

According to a second aspect of the present invention, there is provided a mask for exposure, comprising:

a light transmitting substrate;

a plurality of substantially oblong, island-like light transmitting sections arranged periodically on the substrate;

an opaque section formed on the substrate except where the light transmitting sections are arranged; and a plurality of phase shifter layers selectively formed in the light transmitting sections, wherein the plurality of light transmitting sections are regions for forming a plurality of memory cells constituting a memory cell array, and the memory cell array includes a plurality of bit lines and a plurality of word lines crossing each other, the plurality of light transmitting sections are formed out of the same pattern and arranged oblongly at a fixed period in a direction of the bit lines and at regular intervals in a direction of the word lines, the light transmitting sections being formed on the bit lines and shifted in sequence every ⅓ of the fixed period in one direction of the bit lines, and one of the plurality of phase shifter layers is formed in one of paired light transmitting sections which is adjacent to each other in the direction of the bit line, the one of the paired light transmitting sections being opposite to each other at end portions thereof in an elongating direction of the oblong island-like light transmitting sections and being opposite with a smaller interval than an interval from any other of said light transmitting sections thereto at any portions other than the end portions, and another one of the plurality of phase shifter layers is formed in one of another paired light transmitting sections which is adjacent to each other in the direction of the word line, the one of another paired light transmitting sections having a maximum opposite side length among the other paired light transmitting sections.

It is preferable that each of the plurality of light transmitting sections should have a contact hole in a central part thereof, to which a corresponding one of the bit lines is connected, and contact holes at end portions thereof, to which capacitors are connected.

It is preferable that the plurality of phase shifter layers shift phases of light transmitted through the light transmitting sections substantially 180 degrees.

According to the second aspect of the present invention described above, not only the same results as those of the first aspect, but also the following results can be obtained. Since a phase shifter layer is formed in one of paired light transmitting sections, which are arranged in a direction perpendicular to their longitudinal direction and opposed with the maximum length in the longitudinal direction, these light transmitting sections can reliably be separated from each other.

According to a third aspect of the present invention, there is provided a mask for exposure, comprising:

a light transmitting substrate;

a plurality of island-like light transmitting sections arranged periodically on the substrate;

an opaque section formed on the substrate except where the light transmitting sections are arranged; and a plurality of phase shifter layers selectively formed in the light transmitting sections, wherein the plurality of phase shifter layers are selectively arranged in such a manner that rays of the same phase are radiated to at least one pair of the light transmitting sections through which corresponding portions respectively located on both sides of one of a plurality of wirings formed on a substrate are irradiated, and rays of opposite phases are respectively radiated to at least another pair of the light transmitting sections through which corresponding portions adjacent to each other along one side of one of the plurality of wirings formed on the substrate is irradiated.

The plurality of wirings can serve as bit lines or word lines of a semiconductor memory device.

It is preferable that the plurality of phase shifter layers shift phases of light transmitted through the light transmitting sections by substantially 180 degrees.

According to the third aspect of the present invention described above, a phase shifter layer is arranged in one of paired patterns with one of to-be-exposed underlying wiring layers interposed therebetween such that phases of light transmitted through the paired patterns are the same, and another phase shifter layer is arranged in one of adjacent patterns arranged along one of to-be-exposed underlying wiring layers such that phases of light transmitted through the adjacent patterns are opposite to each other. Therefore, an interval between patterns spaced by a wiring layer is narrowed; however, if contact holes are formed in self-alignment with the wiring layer, a short circuit can be prevented from occurring between the holes.

According to a fourth embodiment of the present invention, there is provided a mask for exposure, comprising:

a light transmitting substrate;

a plurality of light transmitting sections arranged on the substrate;

an opaque section formed on the substrate except where the light transmitting sections are arranged; and a plurality of phase shifter layers selectively formed in the light transmitting sections, wherein the plurality of phase shifter layers are selectively arranged in such a manner that rays of the same phase are radiated to at least adjacent two of the light transmitting sections through which corresponding portions separately located on at least adjacent two of a plurality of island-like conductors formed on a substrate are irradiated, and rays of opposite phases are respectively radiated to at least opposing two of the light transmitting sections through which corresponding portions separately located on at least adjacent two of the plurality of island-like conductors formed on the substrate are irradiated.

The plurality of light transmitting sections can be arranged to form contact hole patterns of a semiconductor device.

Different potentials can be applied to adjacent two of the plurality of island-like conductors.

The rays of the same phase through the adjacent two of the light transmitting sections can be radiated to the portions separately located on the at least adjacent two of the plurality of island-like conductors to which the same potential is applied.

It is preferable that the plurality of phase shift layers shift phases of light transmitted through the light transmitting sections by substantially 180 degrees.

According to the fourth aspect of the present invention described above, phase shifter layers can be so arranged that the phases of light transmitted through hole patterns connected to the same island-like underlying layer to be exposed are the same and those of light transmitted through hole patterns connected to adjacent different island-like underlying layers to be exposed are opposite to each other. This arrangement enables adjacent hole patterns to be reliably separated from each other.

Furthermore, phase shifter layers can be so arranged that the phases of light transmitted through hole patterns connected to the same terminal are the same and those of light transmitted through hole patterns connected to another terminal adjacent thereto are opposite. This arrangement also enables hole patterns connected to different terminals (wirings) to be reliably separated from each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A to 1D are a cross-sectional view of a prior art mask for exposure, a graph of the distribution of amplitudes of light transmitted through the mask, that of the distribution of amplitudes of light transmitted to the wafer, and that of intensities of light transmitted to the wafer, respectively;

FIGS. 2A to 2D are a cross-sectional view of an alternated phase shifting mask, a graph of the distribution of amplitudes of light transmitted through the mask, that of the distribution of amplitudes of light transmitted to the wafer, and that of intensities of light transmitted to the wafer, respectively;

FIGS. 3A to 3C are views showing the prior art mask using phase shifters arranged in active region patterns of a DRAM, the intensity of light on the mask taken along line 3B—3B of FIG. 3A, and the state of shortening caused in contact areas, respectively;

FIGS. 4A to 4C are views for explaining a mask for exposure according to a first embodiment of the present invention, and showing the mask arrangement wherein phase shifters are arranged in active region patterns of a DRAM cell, the intensity of light on the mask taken along line 4B—4B of FIG. 4A, and the intensity of light on the mask taken along line 4C—4C of FIG. 4A, respectively;

FIG. 5 is a view showing a mask for exposure according to a second embodiment of the present invention, the mask including phase shifters arranged in active region patterns of a DRAM cell of a ¼ pitch array system;

FIG. 6 is a view showing a mask for exposure according to a third embodiment of the present invention, the mask including phase shifters arranged in active region patterns of a DRAM cell of a ¼ pitch array system;

FIG. 9 is a view showing a mask for exposure according to a sixth embodiment of the present invention, the mask including phase shifters arranged in active region patterns of a DRAM cell of a ⅓ pitch array system;

FIG. 10 is a view showing a mask for exposure according to a seventh embodiment of the present invention, the mask including phase shifters arranged in storage electrode patterns of a DRAM cell of a ⅓ pitch array system;

FIG. 11A is a view showing a mask for exposure according to an eighth embodiment of the present invention, the mask including phase shifters arranged in storage electrode patterns of a DRAM cell of a ¼ pitch array system;

FIG. 11B is a view of a modification to the mask shown in FIG. 11A;

FIG. 13 is a view showing a mask for exposure according to a tenth embodiment of the present invention, the mask including phase shifters arranged in storage electrode patterns of a DRAM cell of a ½ pitch array system;

FIG. 14A is a view showing a mask for exposure according to an eleventh embodiment of the present invention, the mask including phase shifters arranged in storage electrode patterns of a DRAM cell of a ½ pitch array system;

FIG. 14B is a view of a modification to the mask shown in FIG. 14A;

FIG. 15A is a view showing a mask for exposure according to a twelfth embodiment of the present invention, the mask including phase shifters arranged in storage electrode patterns of a DRAM cell of a ⅓ pitch array system;

FIGS. 15B and 15C are views each showing a modification to the mask of FIG. 15A;

FIG. 16 is a view showing a mask for exposure according to a thirteenth embodiment of the present invention, the mask including phase shifters formed in storage electrode patterns of a DRAM cell of a ⅓ pitch array system;

FIG. 19 is a view showing a mask for exposure according to a fifteenth embodiment of the present invention, on which an underlying wiring layer to be exposed is superposed, the mask including phase shifters arranged in storage electrode patterns of a DRAM cell of a ½ pitch array system;

FIG. 21A is a view showing a mask for exposure according to a sixteenth embodiment of the present invention, the mask including phase shifters arranged in hole patterns through which plugs are buried in a DRAM cell of a ⅓ pitch array system;

FIG. 21B is a view of a modification to the mask of FIG. 21A; and

FIG. 22 is a view showing a mask for exposure according to a seventeenth embodiment of the present invention, the mask including phase shifters arranged in contact hole patterns.

DETAILED DESCRIPTION OF THE PREFERRED EMBODIMENTS

Figure 7:
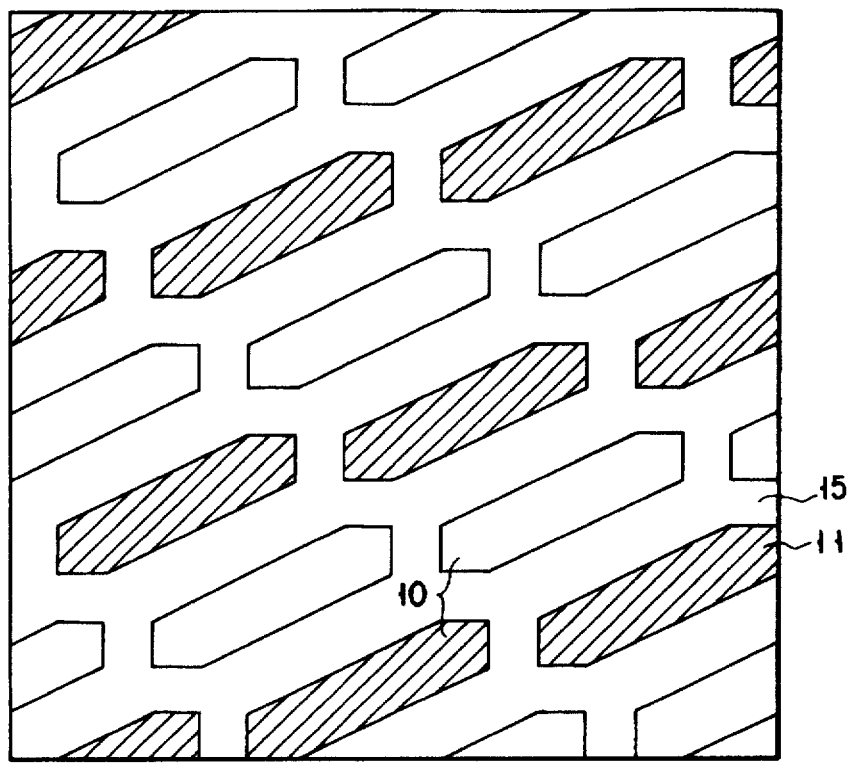
FIG. 7 is a view showing a mask for exposure according to a fourth embodiment of the present invention, the mask including phase shifters arranged in active region patterns of a DRAM cell of a ¼ pitch array system.

Embodiments of the present invention will now be described with reference to the accompanying drawings.

(First Embodiment)

FIG. 4A is a plan view of a mask for exposure including phase shifters formed in active region patterns of a DRAM cell of a ¼ pitch array system. In FIG. 4A, reference numeral 10 indicates patterns of light transmitting sections and numeral 15 denotes an opaque film forming region, and hatched portions 11 are shifter forming portions of the light transmitting sections 10. Though not shown, the section taken along line 4B—4B, for example, is the same as that in FIG. 2A, and the patterns are formed on a transmitting substrate 20. The mask of FIG. 4A and the prior art mask of FIG. 3A are the same in the entire layout of patterns but different in layout of phase shifters.

The phases of light transmitted through adjacent two patterns whose end portions are opposed to each other with the minimum interval x are opposite to each other, whereas those of light transmitted through other adjacent patterns which are not opposed with the minimum interval are the same.

For example, as shown in FIG. 4A, the end portion of pattern D is opposed to that of each of patterns E, F and C with the minimum interval x, and a phase shifter is formed in the pattern D such that the phase of light transmitted through the pattern D is opposite to that of light transmitted through the patterns E, F and C.

The patterns of light transmitting sections 10 are each shaped like a hook. The hook is obtained by upwardly bending one end portion of a rectangular pattern extending in a lateral direction of FIG. 4A and downwardly bending the other end portion thereof. A bit line contact hole is formed in the center of the pattern, and a storage electrode contact hole is formed at each end portion thereof, though not shown in FIG. 4A. The phase shifter shifts the phase of transmitted light 180 degrees to make the phases of light transmitted through adjacent patterns opposite to each other.

According to the layout of phase shifters shown in FIG. 4A, since the phases of light transmitted through adjacent patterns whose end portions are opposed to each other, are always opposite to each other, the profile of light intensity at the end portions of the patterns can be varied sharply, and the end portions can be set at close range to each other. As a result, a space for forming a storage electrode contact at each of the end portions can be expected greatly in the subsequent process.

The first embodiment described above allows both adequate resolution and adequate focal depth even for an island-like pattern which was conventionally difficult to use for a phase shifting mask, with the result that a semiconductor device with high packed density and high performance can be achieved. Since the use of such a phase shifting mask enhances the performance of an exposure apparatus to the ultimate, a semiconductor device with high packed density and high performance can be manufactured at low cost.

(Second Embodiment)

FIG. 5 illustrates a modification to the first embodiment, in which the patterns of light transmitting sections are shaped oblongly, that is, they are arranged by the ¼ pitch array system and inclined in one direction.

In the layout shown in FIG. 5, since distance y between patterns I and H can be set greater than distance x between G and I and between G and H, not only the same result as that of the first embodiment can be obtained, but also the patterns I and H in the same phase can reliably be separated from each other.

(Third Embodiment)

In the layout shown in FIG. 6, the separation of adjacent patterns arranged in a vertical direction of FIG. 6 is prioritized. For example, the end portions of patterns J and L are opposed to each other in the vertical direction of FIG. 6 with an interval p, while the end portions of patterns J and K are opposed to each other in the lateral direction thereof with an interval q. A phase shifter is formed in each of patterns J and K such that the phases of light transmitted through patterns J and L are opposite to each other, whereas those of light transmitted through patterns J and K are the same. Since patterns J and K are in the same phase if the separation between patterns J and L is prioritized, it is desirable to arrange the patterns so as to satisfy the relationship p<q.

(Fourth Embodiment)

FIG. 7 shows a modification to the third embodiment, in which the patterns of light transmitting sections are also arranged oblongly, that is, they are arranged by the ¼ pitch array system and inclined in one direction.

In this layout, the interval between adjacent patterns arranged in the vertical direction of FIG. 7 can be increased, and the phases of light transmitted through the patterns can be opposed to each other; therefore, the patterns can reliably be separated from each other in the vertical direction.

(Fifth Embodiment)

Figure 8:
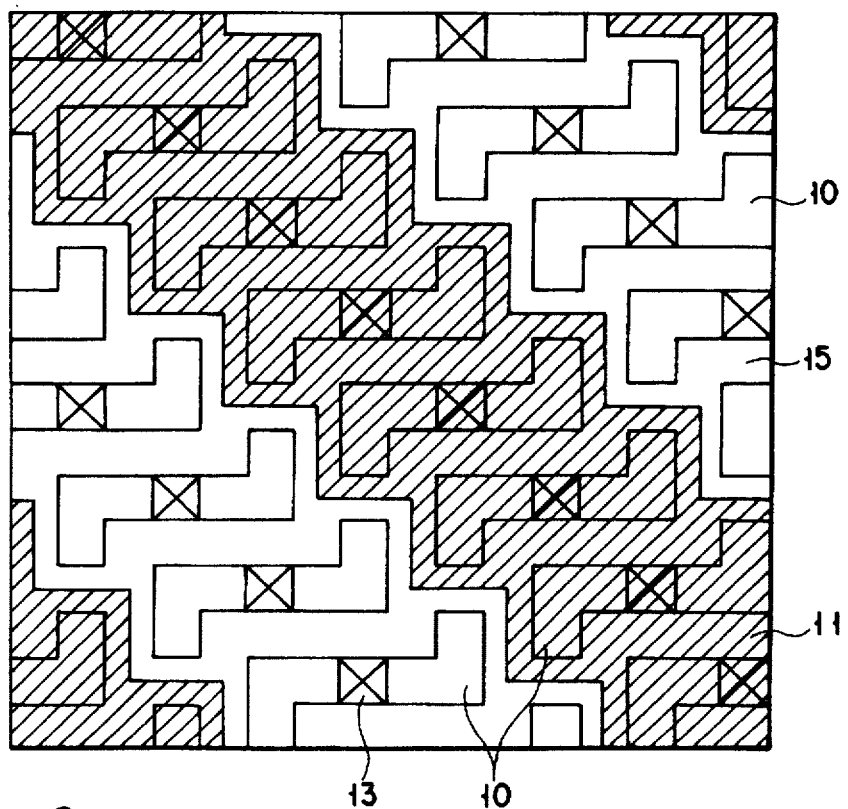
FIG. 8 is a view showing a mask for exposure according to a fifth embodiment of the present invention, the mask including phase shifters arranged so as to cover all of continuous shifter forming regions.

According to the first to fourth embodiments, the phase shifters are formed in their respective island-like patterns; however, as shown in FIG. 8, they can be formed continuously in the area of the same phase. In FIG. 8, reference numeral 10 denotes light transmitting sections serving as element regions and numeral 13 indicates bit line contact regions to be formed afterwards.

In the layout of the fifth embodiment, the pattern of one phase shifter 11 is increased in size and the number of such patterns is decreased, thus facilitating lithography for arranging the phase shifters.

(Sixth Embodiment)

FIG. 9 is a plan view of a mask for exposure including phase shifters arranged in active region patterns of a DRAM cell of a ⅓ pitch array system. (In this system, the active region patterns are formed periodically along the bit lines. The patterns are shifted ⅓ period between adjacent first and second bit lines and then shifted ⅓ period in the same direction between adjacent second and third bit lines. This arrangement is thus repeated periodically every three bit lines.) The patterns of light transmitting sections are oblong ones extending in the lateral direction of FIG. 9. The phase shifters are so arranged that the phases of light transmitted through adjacent patterns, arranged in their longitudinal direction, are opposite to each other, and the phases of light transmitted through adjacent patterns, arranged in a direction perpendicular to the longitudinal direction and opposed to each other with a greater opposing length, are also opposite to each other.

As shown in FIG. 9, for example, the phase shifters are arranged such that the phase of light transmitted through each of two patterns adjacent to pattern M at end portions is opposite to that of light transmitted through pattern M. Patterns N and O are located in parallel with pattern M, and patterns M and N are opposed with length z, while patterns M and O are opposed with length w. Since z is greater than w, the phases of light transmitted through patterns M and N are opposite to each other, and those of light transmitted through patterns M and O are the same.

According to such a layout of phase shifters, not only the same result as that of the first embodiment can be obtained, but also the island-like patterns can easily be separated from each other. In addition, a short circuit is unlikely to occur between the patterns M and O since the phases are the same between them but the length w is short.

(Seventh Embodiment)

FIG. 10 shows a layout of phase shifters formed in storage electrode patterns of a DRAM cell of the ⅓ pitch array system. This layout is identical with that of the sixth embodiment; accordingly, the same result can be obtained.

(Eighth Embodiment)

FIG. 11A is a plan view of a mask for exposure according to an eighth embodiment of the present invention, in which phase shifters are arranged in storage electrode contact hole patterns of a DRAM cell of the ¼ pitch array system. In FIG. 11A, reference numeral 10 indicates patterns of light transmitting sections, numeral 15 represents an opaque film forming region, and hatched portions 11 are phase shifter forming portions of the light transmitting sections. The phase shifters each shifts the phase of transmitted light 180 degrees to make the phases of light transmitted through adjacent patterns opposite to each other.

In the eighth embodiment, a phase shifter is formed in one of paired hole patterns adjacent to each other such that an interval therebetween is minimized.

For example, pattern A is opposed to patterns B and C with the minimum interval x, and phase shifters are arranged in patterns B and C such that the phase of light transmitted through pattern A is opposite to that of light transmitted through patterns B and C. Moreover, the phase shifters are arranged such that the phases transmitted through patterns arranged on the lower left side of pattern A (the distance between them is not shortest) are the same, as are the phases transmitted through patterns on the upper right sides of patterns B and C (the distance between them is not shortest).

According to the array of phase shifters shown in FIG. 11A, since the phases of light transmitted through the closest patterns are opposite to each other, the profile of light intensity of the patterns can be varied sharply and minute contact hole patterns can be separated from each other.

FIG. 11B shows a modification to the eighth embodiment of FIG. 11A. The phase shifters are formed in their respective hole patterns in the example of FIG. 11A, whereas they can be arranged in the entire region in the same phase as shown in FIG. 11B. With the arrangement of FIG. 11A, the area of each phase shifter is increased but the number of phase shifters is decreased, thereby facilitating lithography for forming the phase shifters.

The eighth embodiment allows both adequate resolution and adequate focal depth even for a device pattern such as a contact hole which was conventionally difficult to use for a phase shifting mask, with the result that a semiconductor device with high packing density and high performance can be achieved. Since the use of such a phase shifting mask enhances the performance of an exposure apparatus to the ultimate, a semiconductor device with high packing density and high performance can be manufactured at low cost.

(Ninth Embodiment)

Figure 12A:
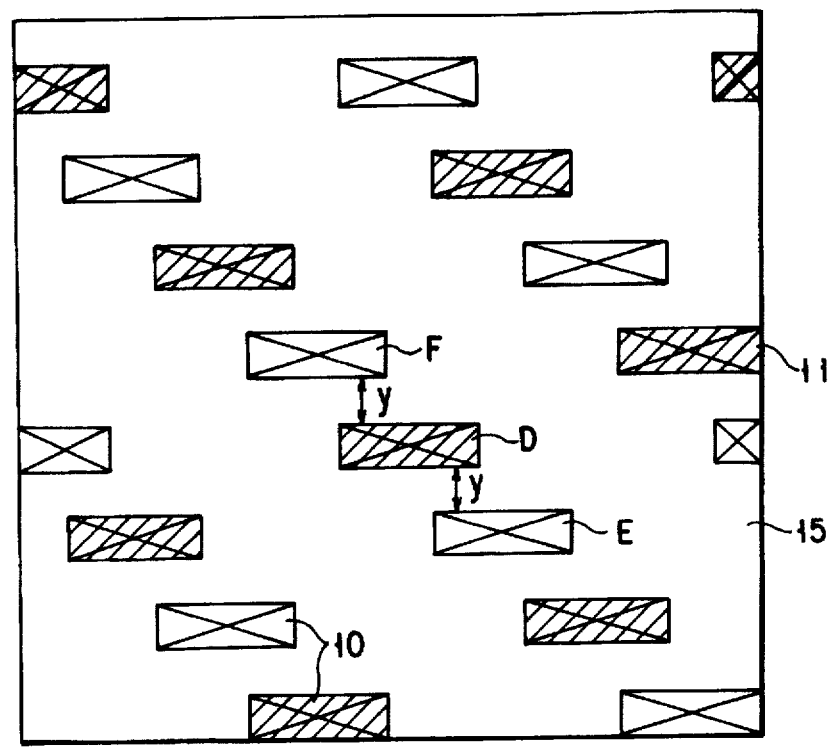
FIG. 12A is a view showing a mask for exposure according to a ninth embodiment of the present invention, the mask including phase shifters arranged in storage electrode patterns of a DRAM cell of a ¼ pitch array system.

FIG. 12A is a plan view of a mask for exposure according to a ninth embodiment of the present invention, which includes phase shifters formed in bit line contact patterns of a DRAM cell of the ¼ pitch array system. Referring to FIG. 12A, pattern D is opposed to patterns E and F with the minimum interval y, and a phase shifter is formed in the pattern D such that the phase of light transmitted through pattern D is opposite to the phases of light transmitted through patterns E and F.

Figure 12B:
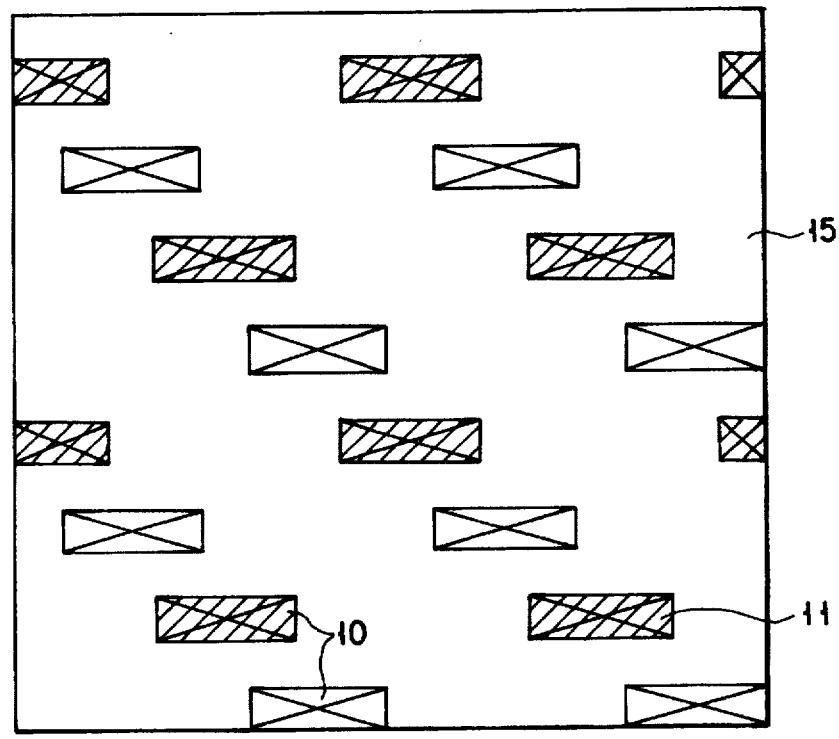
FIG. 12B is a view of a modification to the mask shown in FIG. 12A.

FIG. 12B shows a modification to the ninth embodiment of FIG. 12A. In this modification, the phase shifters are arranged such that not only the phases of light transmitted through patterns opposed with the minimum interval are opposite to each other, but also the phases of light transmitted through patterns arranged on the same line in the bit line direction are the same.

(Tenth Embodiment)

FIG. 13 is a plan view of a mask for exposure according to a tenth embodiment of the present invention, which includes phase shifters arranged in storage electrode contact patterns of a DRAM cell of the ½ pitch array system. In FIG. 13, for example, a phase shifter is arranged in pattern G in such a manner that the phase of light transmitted through pattern G is opposite to those of light transmitted through patterns H and I which are opposed to pattern G with the minimum interval x. Since there is an adequate interval z between pattern G and each of patterns K and J, the phases of light transmitted through patterns G, K and J can be the same. In the tenth embodiment, too, since the phases of light transmitted through patterns on the same line are the same, the phase shifters can easily be arranged.

11

(Eleventh Embodiment)

FIG. 14A is a plan view of a mask for exposure according to an eleventh embodiment of the present invention, which includes phase shifters arranged in trench capacitor patterns of a DRAM cell of the ½ pitch array system. In this embodiment, for example, a phase shifter is arranged in pattern L in such a manner that the phases of light transmitted through patterns L and M are opposite to each other when the interval x between the centroids of these patterns is smaller than the interval z between the centroids of patterns L and N and between those of patterns L and O. Since z>x, the phases of light transmitted through patterns L and N can be the same, as can be those of light transmitted through patterns L and O. Since the phases of light transmitted through adjacent patterns arranged in the lateral direction of FIG. 14A, with interval z which is not the minimum, are the same, the phase shifters can continuously be formed every two columns. In this case, the phase shifters can be formed continuously in the plural patterns, they can easily be arranged.

FIG. 14B is a modification to the eleventh embodiment shown in FIG. 14A. In this modification, the phases of light transmitted through adjacent patterns arranged with an interval z between their centroids, are opposite to each other.

(Twelfth Embodiment)

FIG. 15A is a plan view of a mask for exposure according to a twelfth embodiment of the present invention, which includes phase shifters arranged in storage electrode contact patterns of a DRAM cell of the ⅓ pitch array system. In the twelfth embodiment, for example, a phase shifter is arranged in pattern P such that the phases of light transmitted through patterns P and Q opposed to each other with the minimum interval x are opposite to each other. In this embodiment, too, since the phases of light transmitted through patterns arranged adjacent to each other, with an interval which is not the minimum, are the same, the phase shifters can easily be formed in the patterns.

FIGS. 15B and 15C each show a modification to the arrangement of phase shifters of FIG. 15A. In this modification, too, a phase shifter is arranged in pattern P such that the phases of light transmitted through patterns P and Q opposed to each other with the minimum interval x are opposite to each other, and the phases of light transmitted through adjacent patterns arranged with an interval which is not the minimum are the same.

(Thirteenth Embodiment)

FIG. 16 is a plan view of a mask for exposure according to a thirteenth embodiment of the present invention, which includes phase shifters arranged in bit line contact patterns of a DRAM cell of the ⅓ pitch array system. In this embodiment, for example, a phase shifter is arranged in pattern R in such a manner that the phases of light transmitted through patterns R and S opposed to each other with the minimum interval x are opposite to each other and so are those of light transmitted through patterns R and T opposed to each other.

(Fourteenth Embodiment)

Figure 17A:
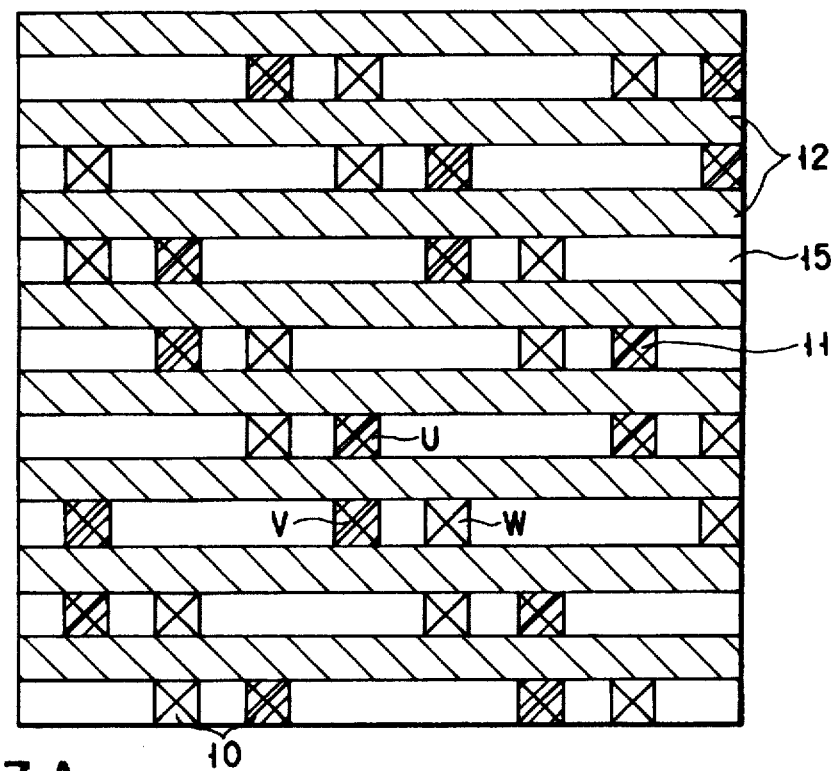
FIG. 17A is a view showing a mask for exposure according to a fourteenth embodiment of the present invention, on which an underlying wiring layer to be exposed is superposed, the mask including phase shifters formed in storage electrode patterns of a DRAM cell of a ¼ pitch array system.

FIG. 17A is a plan view of a mask for exposure according to a fourteenth embodiment of the present invention, on which an underlying wiring layer pattern to be exposed is superposed and which includes phase shifters arranged in storage electrode patterns of a DRAM cell of the ¼ pitch array system.

12

As shown in FIG. 17A, for example, patterns U and V are arranged opposite to each other, with a bit line 12 interposed therebetween and serving as an underlying wiring layer of the DRAM cell, and patterns V and W are arranged adjacent to each other on the same row. In this arrangement, the separation between patterns V and W has priority over that between pattern U and V. More specifically, phase shifters are arranged in patterns U and V in such a manner that the phases of light transmitted through patterns opposed with bit line 12 interposed therebetween are the same and those of light transmitted through adjacent patterns on the same row are opposite to each other.

Though the opposed patterns U and V are in the same phase, even though they are separated incompletely, a short circuit between them can be avoided by self-aligning a contact hole with the bit line 12.

Figure 17B:
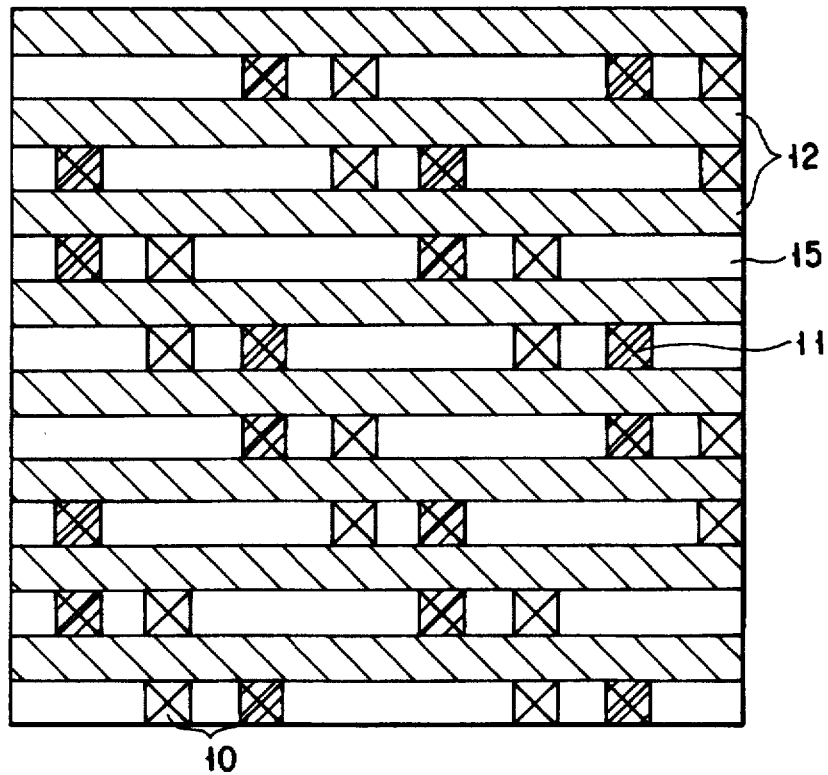
FIG. 17B is a view of a modification to the mask shown in FIG. 17A.

FIG. 17B illustrates a modification to the arrangement of phase shifters shown in FIG. 17A. In this modification, the phases of light transmitted through patterns on the same row (in the direction of word lines) are the same.

Figure 18A:
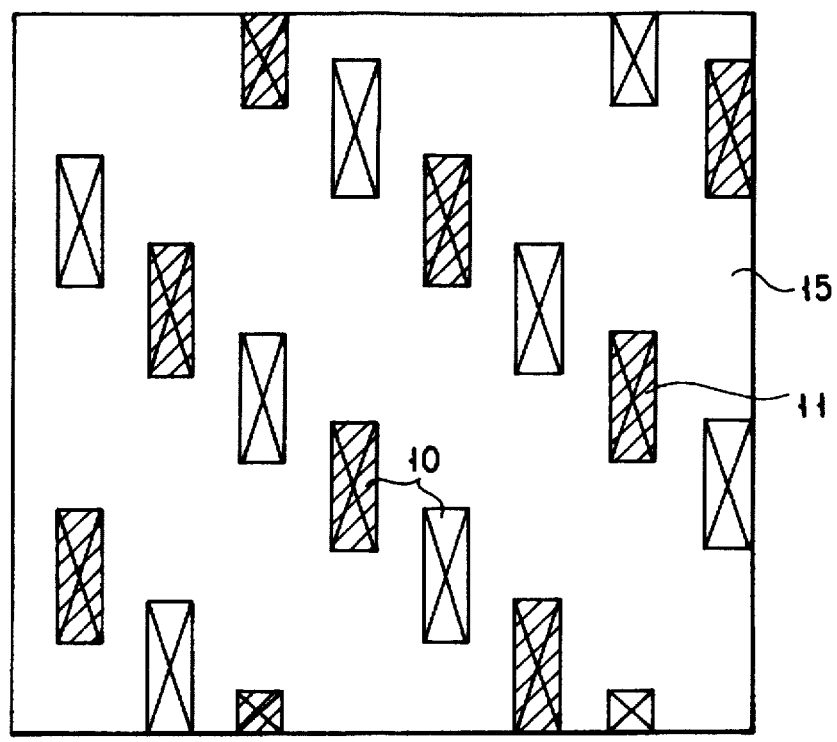
FIGS. 18A and 18B are views showing modifications to the masks of FIGS. 17A and 17B, respectively.
Figure 18B:
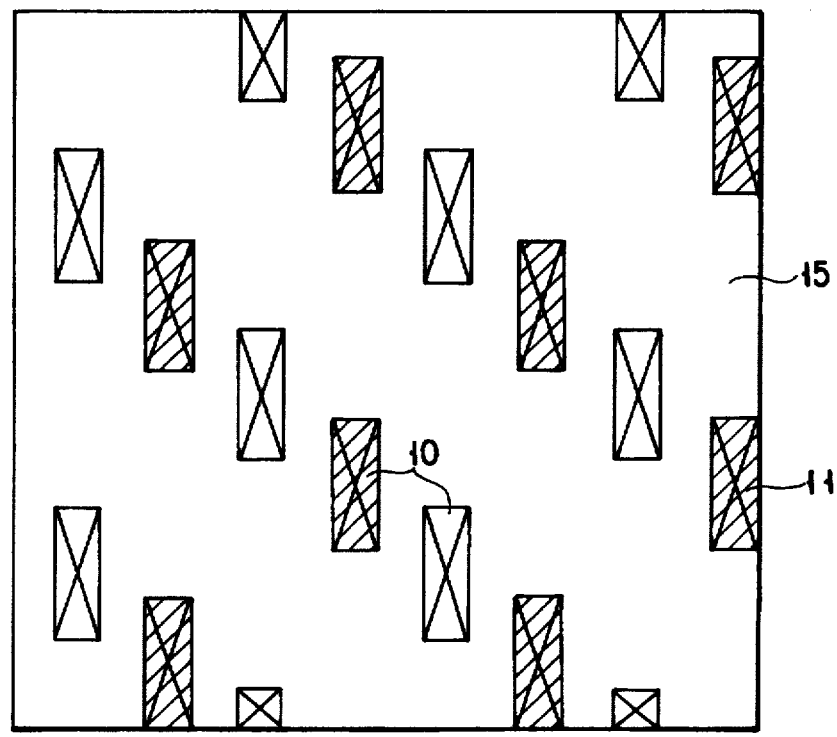

FIGS. 18A and 18B show modifications to the arrangements of FIGS. 17A and 17B, respectively. Patterns U and V of FIG. 17A are coupled to each other in the modification of FIG. 18A, as are patterns U and V of FIG. 17B in the modification of FIG. 18B. The coupling of patterns facilitates the arrangement of phase shifters. The mask patterns shown in FIGS. 18A and 18B each represent the original mask pattern where none of bit lines 12 appear.

(Fifteenth Embodiment)

FIG. 19 is a plan view showing a mask for exposure according to a fifteenth embodiment of the present invention on which an underlying wiring layer pattern to be exposed is superposed. In this mask, element regions are arranged by the ½ pitch array system, and phase shifters are arranged in hole patterns for forming buried plugs of a DRAM cell of a two-cell one-bit-line contact system.

In the fifteenth embodiment, the phases of light transmitted through patterns formed in the same element region are the same and opposite to those of light transmitted through patterns formed in its adjacent element region. Furthermore, the phases of light transmitted through adjacent bit line contact patterns 32 interposed between gate electrodes (word lines) 50 serving as underlying wiring layers are the same, while the phases of light transmitted through capacitor contact pattern 31 and its adjacent pattern both arranged outside the gate electrodes are opposite to each other.

More specifically, phase shifters are arranged in patterns 31, 32 and 33 connected to the same element region 30, and the phases of light transmitted through these patterns are opposite to those of light transmitted through patterns 41, 42 and 43 connected to an element region 40 adjacent to the region 30.

The above arrangement of phase shifters prevents the buried plugs from being short-circuited between different element regions. Though the phases of light transmitted through patterns 31, 32 and 33 connected to the same element region 30 are the same, if holes are formed in self-alignment with gate electrodes (word lines) 50 as shown in FIG. 19, a short circuit can be prevented from being caused between the holes.

Figure 20A:
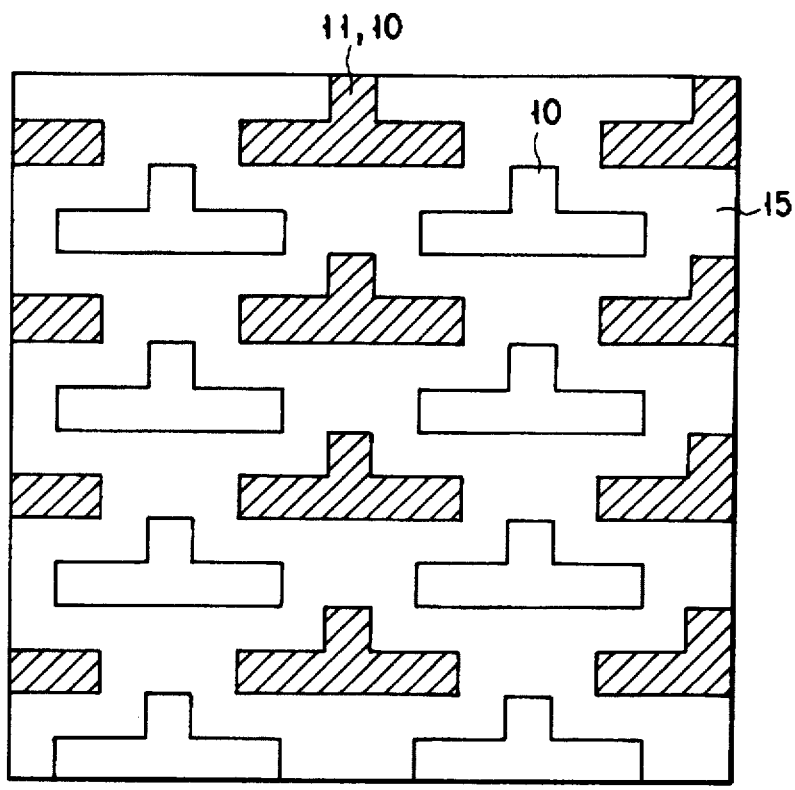
FIGS. 20A and 20B are views showing modifications to the masks of FIGS. 17A and 19, respectively.

FIG. 20A illustrates a modification to the arrangement of phase shifters of FIG. 19. In this modification, for example, patterns 31, 32 and 33 of FIG. 19 are coupled to one another, and phase shifters are each formed in a reversed T-shaped pattern. In this case, the phase shifters are each increased in area and decreased in number, thus facilitating lithography for forming the phase shifters.

Figure 20B:
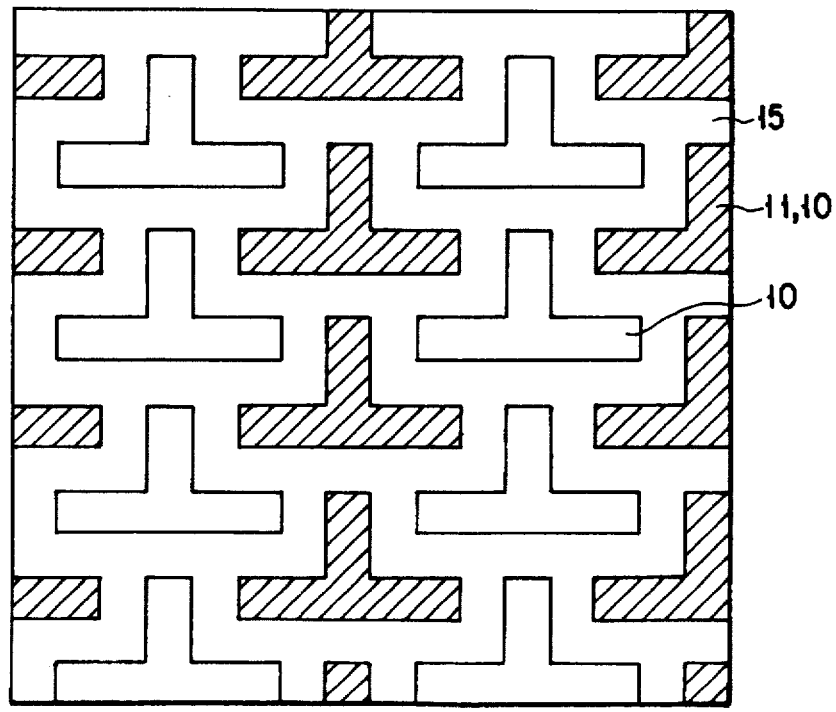

FIG. 20B also illustrates a modification to the arrangement of phase shifters of FIG. 19. In this modification, part of the reversed T-shaped pattern of FIG. 20A is lengthened; therefore, a margin for short circuit can be increased.

The modifications shown in FIGS. 20A and 20B each represent the original mask pattern where neither gate electrodes 50 nor contact regions appear.

(Sixteenth Embodiment)

FIG. 21A is a plan view of a mask for exposure according to a sixteenth embodiment of the present invention, which includes phase shifters arranged in hole patterns for forming buried plugs of a DRAM cell of the ⅓ pitch array system.

In this embodiment, phase shifters are so arranged that the phases of light transmitted through hole patterns connected to one element region are the same and opposite to those of light transmitted through hole patterns connected to its adjacent element region.

FIG. 21B is a modification to the arrangement of phase shifters of FIG. 21A. This modification is similar to the arrangement of FIG. 21A in that the phases of light transmitted through hole patterns connected to the same element region are the same. However, the phases of light transmitted through hole patterns of adjacent element regions in their longitudinal direction are the same, while those of light transmitted through hole patterns of adjacent element regions in the direction perpendicular to the longitudinal direction are opposite to each other. In this modification, the separation between the hole patterns of adjacent element regions arranged in the longitudinal direction is disadvantageous, but the phase shifters can easily be arranged.

(Seventeenth Embodiment)

FIG. 22 is a plan view showing a mask for exposure according to a seventeenth embodiment of the present invention. This mask includes phase shifters arranged on contact hole patterns formed correspondingly to underlying wiring layers 71 to 75. The phase shifters are so arranged that the phases of light transmitted through patterns connected to the same terminal (wiring) are the same and opposite to those of light transmitted through patterns connected to its adjacent terminal (wiring).

In the seventeenth embodiment, the separation of contact holes connected to different terminals (wirings) is prioritized, and the arrangement of the phase shifters can prevent a short circuit from being caused between the wirings through the contact holes. Though the phases of light transmitted through the patterns connected to the same terminal are the same, even if the contact holes are not separated completely, no problems arise since the terminal to which the holes are connected is set at the same voltage.

The present invention is not limited to the above-described embodiments. Since the relationship in position between phase shifters and device patterns is significant for each of the embodiments, the present invention is not limited to the layer of the embodiments. Furthermore, a remaining pattern can be formed by combining a mask having island-like patterns with a negative resist and a hole pattern can also be formed by combining the mask with a positive resist, irrespective of the type of the resist. Both stack type phase shifters and trench type phase shifters can be employed as phase shifters.

As described in detail above, according to the present invention, since a phase shifter is formed in one of paired light transmitting sections whose end portions are opposed to each other with the minimum interval, the optimum arrangement of phase shifters can be achieved, and minute device patterns can be formed even in island-like patterns.

The optimum arrangement allows a mask for exposure which is capable of forming minute device patterns even in hole patterns.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A mask for exposure, comprising:
    a light transmitting substrate;
    a plurality of substantially oblong, island-like light transmitting sections arranged periodically on said substrate;
    an opaque section formed on said substrate except where said light transmitting sections are arranged; and
    a plurality of phase shifter layers selectively formed in said light transmitting sections,
    wherein said light transmitting sections include paired light transmitting sections arranged substantially in line and opposed to each other at one end portion of each of said paired light transmitting sections, and one of said plurality of phase shifter layers is formed in one of said paired light transmitting sections, an interval between said paired light transmitting sections at the one end portion being smaller than any interval between adjacent ones of said light transmitting sections at portions other than the one end portion.

2. The mask according to claim 1, wherein said plurality of light transmitting sections are regions for forming a plurality of memory cells constituting a memory cell array, and said memory cell array includes a plurality of bit lines and a plurality of word lines crossing each other.

3. The mask according to claim 2, wherein said plurality of light transmitting sections are formed out of the same pattern and arranged at a fixed period in a direction of the bit lines and at regular intervals in a direction of the word lines, said light transmitting sections being formed on the bit lines and shifted in sequence every ¼ of the fixed period in one direction of the bit lines, and each of said light transmitting sections having end portions bent in opposite directions with each other.

4. The mask according to claim 3, wherein said plurality of light transmitting sections include paired light transmitting sections arranged adjacent to each other in the direction of the word lines and opposed to each other at portions other than the one end portion, and phases of light transmitted through said paired light transmitting sections are the same.

5. The mask according to claim 3, wherein said plurality of light transmitting sections include paired light transmitting sections arranged adjacent to each other in the direction of the word lines and opposed to each other at portions other than the one end portion, and phases of light transmitted through said paired light transmitting sections are opposite to each other.

6. The mask according to claim 2, wherein said plurality of light transmitting sections are formed out of the same pattern and arranged at a fixed period in a direction of the bit lines and at regular intervals in a direction of the word lines, said light transmitting sections obliquely crossing the bit lines and being shifted every ¼ of the fixed period in one direction of the bit lines.

7. The mask according to claim 6, wherein said plurality of light transmitting sections include paired light transmitting sections arranged adjacent to each other in the direction of the word lines and opposed to each other at portions other than the one end portion, and phases of light transmitted through said paired light transmitting sections are the same.

8. The mask according to claim 6, wherein said plurality of light transmitting sections include paired light transmitting sections arranged adjacent to each other in the direction of the word lines and opposed to each other at portions other than the one end portion, and phases of light transmitted through said paired light transmitting sections are opposite to each other.

9. The mask according to claim 2, wherein each of said plurality of light transmitting sections has a contact hole in a central part thereof, to which a corresponding one of the bit lines is connected, and contact holes at end portions thereof, to which capacitors are connected.

10. A mask for exposure, comprising:

a light transmitting substrate;

a plurality of substantially oblong, island-like light transmitting sections arranged periodically on said substrate;

an opaque section formed on said substrate except where said light transmitting sections are arranged; and a plurality of phase shifter layers selectively formed in said light transmitting sections, wherein said plurality of light transmitting sections are regions for forming a plurality of memory cells constituting a memory cell array, and said memory cell array includes a plurality of bit lines and a plurality of word lines crossing each other, said plurality of light transmitting sections are formed out of the same pattern and arranged oblongly at a fixed period in a direction of the bit lines and at regular intervals in a direction of the word lines, said light transmitting sections being formed on the bit lines and shifted in sequence every ⅓ of the fixed period in one direction of the bit lines, and one of said plurality of phase shifter layers is formed in one of paired light transmitting sections which is adjacent to each other in the direction of the bit line, said one of the paired light transmitting sections being opposite to each other at end portions thereof in an elongating direction of said oblong island-like light transmitting sections and being opposite with a smaller interval than an interval from any other of said light transmitting sections thereto at any portions other than the end portions, and another one of said plurality of phase shifter layers is formed in one of another paired light transmitting sections which is adjacent to each other in the direction of the word line, said one of another paired light transmitting sections having a maximum opposite side length among said another paired light transmitting sections.

11. The mask according to claim 10, wherein each of said plurality of light transmitting sections has a contact hole in a central part thereof, to which a corresponding one of the bit lines is connected, and contact holes at end portions thereof, to which capacitors are connected.

12. A mask for exposure, comprising:

a light transmitting substrate;

a plurality of island-like light transmitting sections arranged periodically on said substrate;

an opaque section formed on said substrate except where said light transmitting sections are arranged; and a plurality of phase shifter layers selectively formed in said light transmitting sections, wherein said plurality of phase shifter layers are selectively arranged so as to form at least one pair of said light transmitting sections through which rays of the same phase are radiated to corresponding portions respectively located on both sides of one of a plurality of wirings previously formed on a wafer to be processed, and so as to form at least another pair of said light transmitting sections through which rays of opposite phases are respectively radiated to corresponding portions adjacent to each other along one side of one of said plurality of wirings previously formed on said wafer to be processed.

13. The mask according to claim 12, wherein said plurality of wirings are bit lines of a semiconductor memory device.

14. The mask according to claim 12, wherein said plurality of wirings are word lines of a semiconductor memory device.

15. The mask according to claim 12, wherein said plurality of phase shifter layers shift phases of light transmitted through said plurality of light transmitting sections by substantially 180 degrees.

16. A mask for exposure, comprising:

a light transmitting substrate;

a plurality of island-like light transmitting sections arranged on said substrate;

an opaque section formed on said substrate except where said light transmitting sections are arranged; and a plurality of phase shifter layers selectively formed in said light transmitting sections, wherein said plurality of phase shifter layers are selectively arranged so as to form at least an adjacent two of said light transmitting sections through which rays of the same phase are radiated to corresponding portions separately located on one of a plurality of island-like conductors previously formed on a wafer to be processed so as to form at least one pair of said light transmitting sections opposing each other through which rays of opposite phases are respectively radiated to corresponding portions separately located on adjacent two of said plurality of island-like conductors previously formed on said wafer to be processed.

17. The mask according to claim 16, wherein said plurality of light transmitting sections are arranged to form contact hole patterns of a semiconductor device.

18. The mask according to claim 16, wherein different potentials are applied to said adjacent two of said plurality of island-like conductors.

19. The mask according to claim 16, wherein the rays of the same phase through said adjacent two of said light transmitting sections are radiated to said portions separately located on said at least adjacent two of said plurality of island-like conductors to which the same potential is applied.

20. The mask according to claim 16, wherein said plurality of phase shifter layers shift phases of light transmitted through said plurality of light transmitting sections by substantially 180 degrees.

* * * * *